United States Patent
Lin

(10) Patent No.: US 7,499,339 B2
(45) Date of Patent: Mar. 3, 2009

(54) HIGH-PERFORMANCE FLASH MEMORY DATA TRANSFER

(75) Inventor: Jason Lin, Santa Clara, CA (US)

(73) Assignee: SanDisk Corporation, Milpitas, CA (US)

(*) Notice: Subject to any disclaimer, the term of this patent is extended or adjusted under 35 U.S.C. 154(b) by 226 days.

(21) Appl. No.: 11/458,431

(22) Filed: Jul. 19, 2006

(65) Prior Publication Data

US 2008/0019196 A1    Jan. 24, 2008

(51) Int. Cl.
   *G11C 11/34* (2006.01)
(52) U.S. Cl. .............................. 365/185.33; 365/185.11
(58) Field of Classification Search ............ 365/185.33, 365/185.04, 185.11
   See application file for complete search history.

(56) References Cited

U.S. PATENT DOCUMENTS

| | | | |
|---|---|---|---|
| 5,172,338 A | 12/1992 | Mehrotra et al. | |
| 5,581,503 A | 12/1996 | Matsubara et al. | |
| 6,060,916 A | 5/2000 | Park | |
| 6,094,375 A | 7/2000 | Lee | |
| 6,266,273 B1 | 7/2001 | Conley et al. | |
| 6,335,901 B1 | 1/2002 | Morita et al. | |
| 6,563,739 B2* | 5/2003 | Aho et al. ............... | 365/185.23 |
| 6,621,496 B1 | 9/2003 | Ryan | |
| 6,747,892 B2 | 6/2004 | Khalid | |
| 6,882,568 B2* | 4/2005 | Shiota et al. ........... | 365/185.08 |
| 6,922,359 B2* | 7/2005 | Ooishi .................... | 365/185.16 |
| 7,042,768 B2 | 5/2006 | Roohparvar et al. | |
| 7,345,926 B2 | 3/2008 | Kagan et al. | |
| 7,356,646 B2* | 4/2008 | Kim ........................... | 711/115 |
| 7,366,028 B2 | 4/2008 | Kagan et al. | |
| 7,366,029 B2 | 4/2008 | Kagan | |

(Continued)

FOREIGN PATENT DOCUMENTS

WO    95/34030 A2    12/1995

OTHER PUBLICATIONS

"128Mbit DDR SDRAM", Datasheet K4D261638E, Rev. 1.2 (Samsung, Jul. 2003).

(Continued)

*Primary Examiner*—Anh Phung
(74) *Attorney, Agent, or Firm*—Brinks Hofer Gilson & Lione

(57) ABSTRACT

A flash memory system including a flash memory device and a controller, operable according to an advanced data transfer mode is disclosed. The flash memory device is operable both in a "legacy" mode, in which read data is presented by the memory synchronously with each cycle of a read data strobe from the controller, and in which input data is latched by the memory synchronously with each cycle of a write data strobe from the controller. In the advanced mode, which can be initiated by the controller forwarding an initiation command to the memory, the flash memory itself sources the read data strobe and also a write data strobe that is out-of-phase relative to the read data strobe, and presents data synchronously with one of the edges of that read data strobe. In the advanced mode for a data write, the input data is presented by the controller synchronously with a selected edge of both the write data strobe and the read data strobe. The voltage swing of the data and control signals is reduced from conventional standards, to reduce power consumption.

21 Claims, 14 Drawing Sheets

U.S. PATENT DOCUMENTS

| | | |
|---|---|---|
| 2003/0031076 A1 | 2/2003 | Widmer et al. |
| 2003/0043624 A1 | 3/2003 | Roohparvar et al. |
| 2004/0215996 A1 | 10/2004 | Kanamori et al. |
| 2005/0270891 A1 | 12/2005 | Flach et al. |
| 2007/0247933 A1 | 10/2007 | Kagan |
| 2008/0019189 A1 | 1/2008 | Lin |

OTHER PUBLICATIONS

"x32 DDR SDRAM: Device Operation and Timing Diagram" (Samsung).

"DDR SDRAM DIMM: MT4VDDT864A -64MB; MT4VDDT1664A—128MB; MT4VDDT3264A—256MB" (Micron Technology, Inc., 2004).

"CF+ and CompactFlash Specification Revision 3.0" (CompactFlash Association, 2004).

Yoo, "High-Speed DRAM Interface", Potentials, vol. 20, No. 5 (IEEE, 2001), pp. 33-34.

Nakagome et al., "Sub-1-V Swing Internal Bus Architecture for Future Low-Power ULSI's", J. Solid State Circ., vol. 28, No. 4 (IEEE, 1993), pp. 414-419.

Lee et al., "A 1 Gbit Synchronous Dynamic Random Access Memory with an Independent Subarray-Controlled Scheme and a Hierarchical Decoding Scheme", J. Solid State Circ., vol. 33, No. 5 (IEEE, 1998), pp. 779-785.

Ikeda et al., "High-Speed DRAM Architecture Development", J. Solid State Circ., vol. 34, No. 5 (IEEE, 1999), pp. 685-692.

Kirihata et al., "A 390-mm2, 16-Bank, 1-Gb DDR SDRAM with Hybrid Bitline Architecture", J. Solid State Circ., vol. 34, No. 11 (IEEE, 1999), pp. 1580-1588.

Yoon et al., "A 2.5-V, 333-Mb/s/pin, 1-Gbit, Double-Data-Rate Synchronous DRAM", J. Solid State Circ., vol. 34, No. 11 (IEEE, 1999), pp. 1589-1599.

Pilo et al., "An 833-MHz 1.5-W 18-Mb CMOS SRAM with 1.67 Gb/s/pin", J. Solid State Circ., vol. 35, No. 11 (IEEE, 2000), pp. 1641-1647.

Kuge et al., "A 0.18-um 256-Mb DDR-SDRAM with Low-Cost Post-Mold Tuning Method for DLL Replica", J. Solid State Circ., vol. 35, No. 11 (IEEE, 2000), pp. 1680-1689.

Yoo et al., "A 1.8-V 200-Mb/s/pin 512-Mb DDR-II SDRAM With On-Die Termination and Off-Chip Driver Calibration", J. Solid State Circ., vol. 39, No. 6 (IEEE, 2004), pp. 941-951.

Fujisawa et al., "1.8-V 800-Mb/s/pin DDR2 and 2.5-V 400-Mb/s/pin DDR1 Compatibly Designed 1-Gb SDRAM With Dual-Clock Input-Latch Scheme and Hybrid Multi-Oxide Output Buffer", J. Solid State Circ., vol. 40, No. 4 (IEEE, Apr. 2005), pp. 862-869.

2GBIT (256M×8 Bits) CMOS NAND E2PROM, part No. TH58NVG1S3AFT05 (Toshiba, 2003).

"128Mbit DDR SDRAM", Datasheet K4D261638E, Rev. 1.2 (Samsung, Jul. 2003).

"DDR SDRAM DIMM: MT4VDDT864A -64MB; MT4VDDT1664A - 128MB; MT4VDDT3264A - 256MB" (Mircron Technology, Inc., 2004).

"CF + and CompactFlash Specification Revision 3.0" (CompactFlash Association, 2004).

Yoo, "High-Speed DRAM Interface", Potentials, vol. 20, No. 5 (IEEE, 2001), pp. 33-34.

Nakagome et al., "Sub-1-V Swing Internal Bus Architecture for Future Low-Power ULSI's", J. Solid State Circ., vol. 28, No. 4 (IEEE, 1993), pp. 414-419.

Lee et al., "A 1 Gbit Synchronous Dynamic Random Access Memory with an Independent Subarray-Controlled Scheme and a Hierarchical Decoding Scheme", J. Solid State Circ., vol. 33, No. 5 (IEEE, 1998), pp. 779-785.

PCT Search Report -- WO 2007/127678 A3 -- dated Dec. 4, 2007.

* cited by examiner

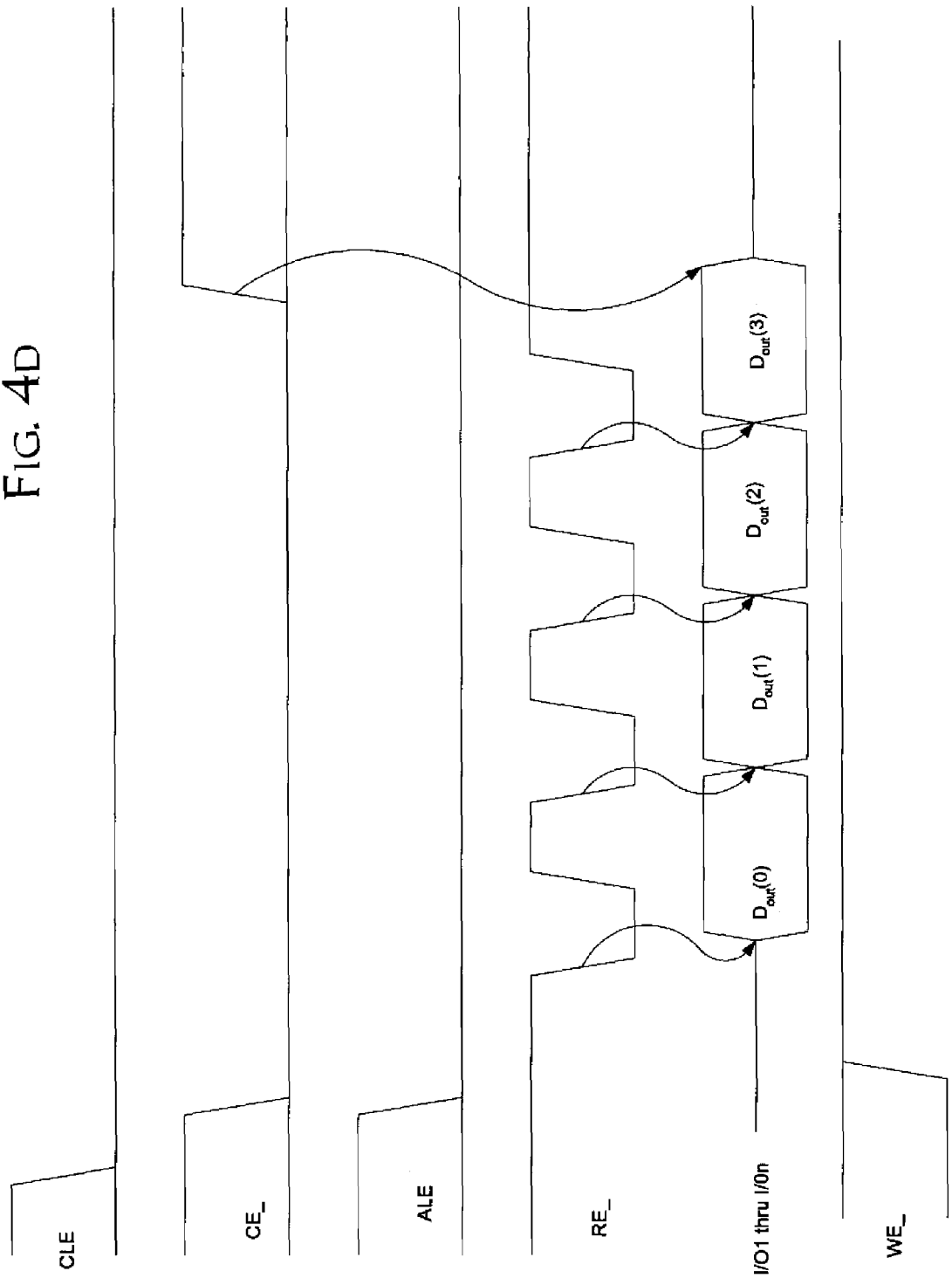

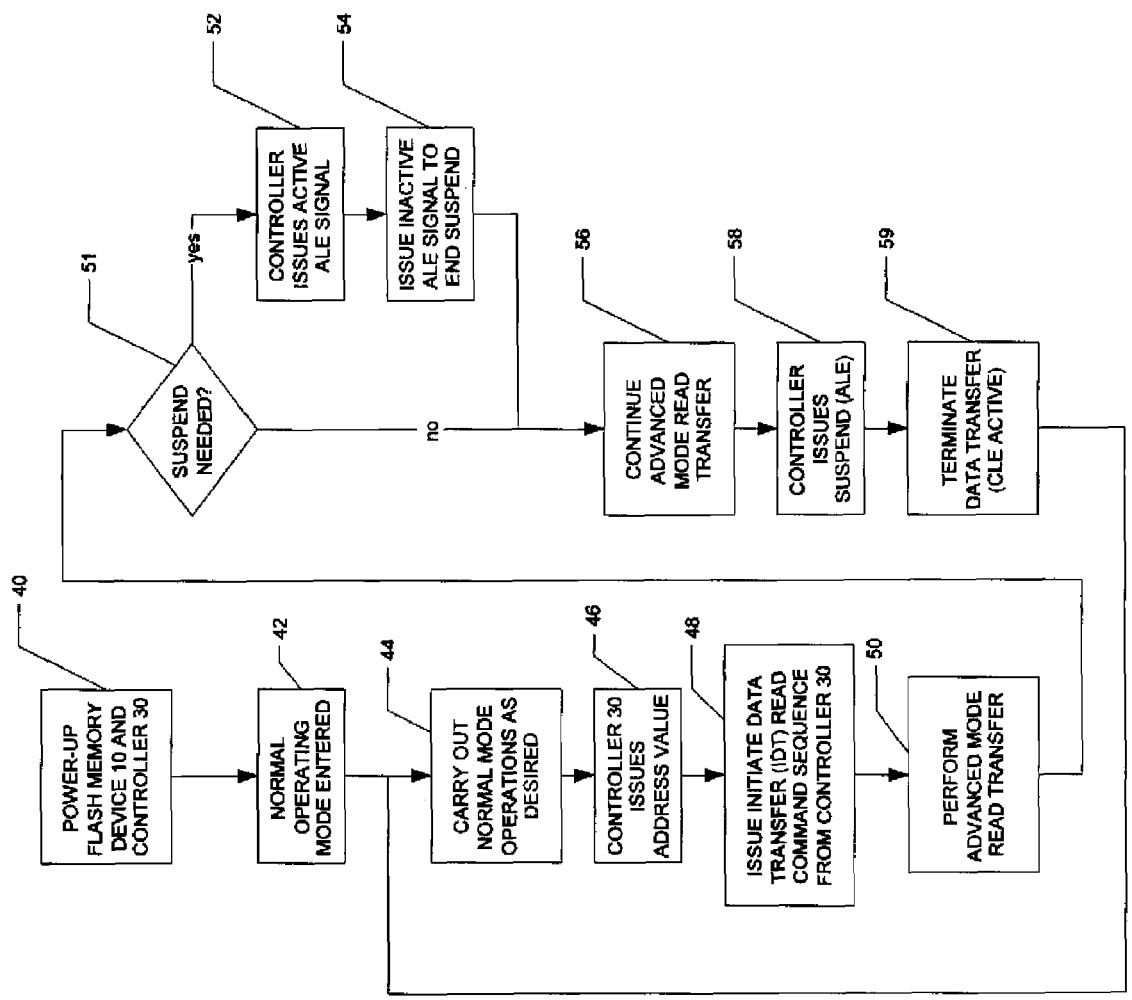

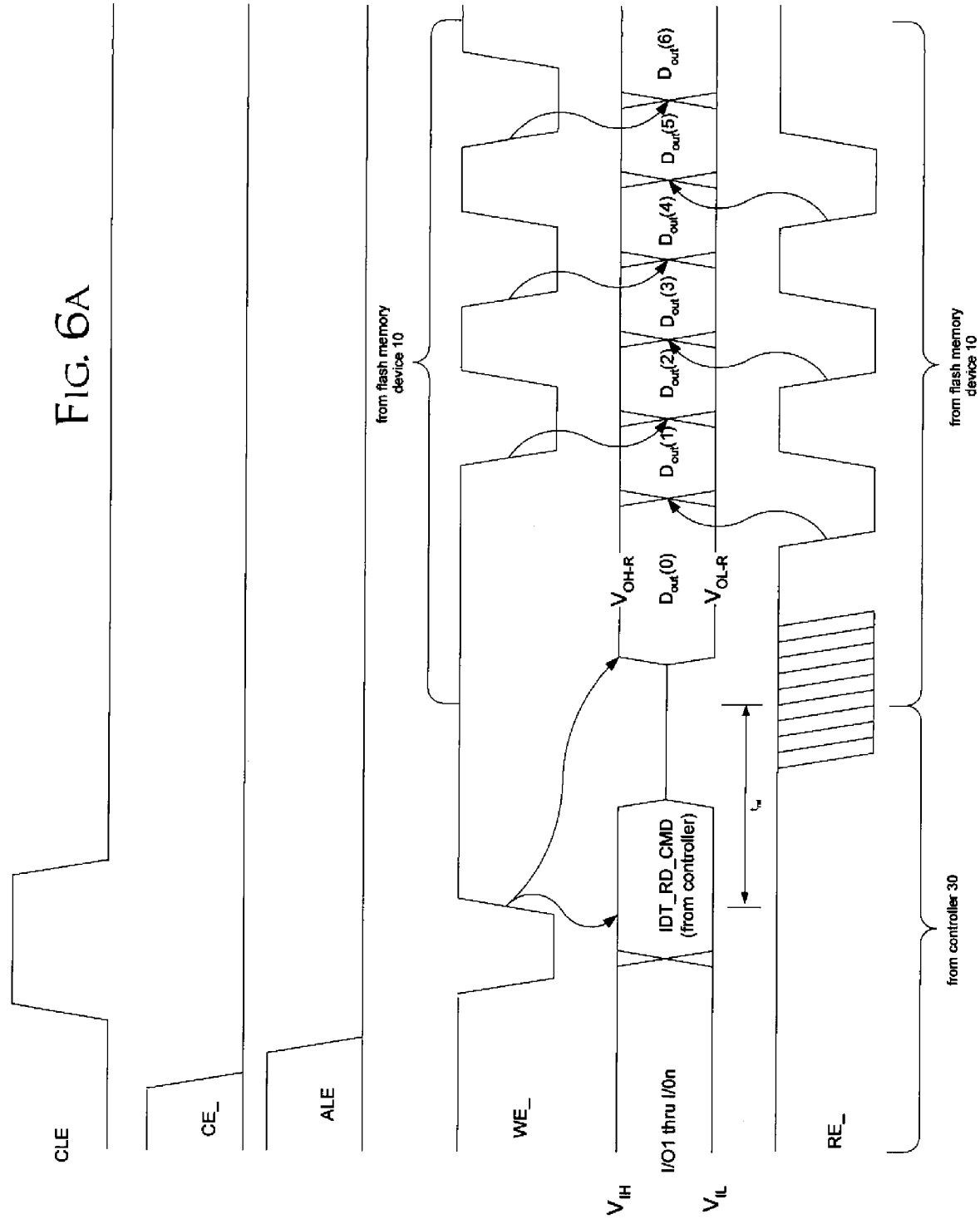

HIGH-PERFORMANCE FLASH MEMORY DATA TRANSFER

CROSS-REFERENCE TO RELATED APPLICATIONS

This application is related to my copending and commonly assigned application Ser. No.11/458,422, filed on the same day as this application, entitled "Method of High-Performance Flash Memory Data Transfer".

STATEMENT REGARDING FEDERALLY SPONSORED RESEARCH OR DEVELOPMENT

Not applicable.

BACKGROUND OF THE INVENTION

This invention is in the field of flash memory devices, and is more specifically directed to data communications between flash memory devices and memory controllers in electronic systems.

As well known in the art, "flash" memories are electrically-erasable semiconductor memory devices that can be erased and rewritten in relatively small blocks, rather than on a chip-wide or large-block basis as in previous electrically-erasable programmable read-only memory (EEPROM) devices. As such, flash memory has become especially popular for applications in which non-volatility (i.e., data retention after removal of power) of the stored data is essential, but in which the frequency of rewriting is relatively low. Examples of popular applications of flash memory include portable audio players, "SIM" card storage of telephone numbers and phone activity in cellular telephone handsets, "thumbkey" removable storage devices for computers and workstations, storage devices for digital cameras, and the like.

An important recent advance in semiconductor non-volatile memory technology is the arrangement of the flash memory cells as "NAND" memory rather than as "NOR" memory. As known in the art, NOR flash memory refers to the conventional arrangement of a column of memory cells in parallel between a bit line and a source line. Access of a specific cell in a NOR column is made by driving its word line (control gate) active while holding the other cells in the column off, so that the current between the bit line and source line is determined by the state of the accessed cell. Memory cells in a column of NAND memory, on the other hand, are connected in series between the bit line and the source line. Accessing of a specific cell in a NAND column thus requires turning on all of the cells in the column with active word line levels, and applying an intermediate word line level to the cell to be accessed, such that the current between the bit line and source line is, again, determined by the state of the accessed cell. As well known in the art, the chip area required per bit of NAND flash memory is much reduced from the area per bit of NOR flash memory, primarily because fewer conductors (and therefore contacts) are required for a column of NAND memory relative to NOR memory; in addition, access transistors can be shared among a large number of cells in the NAND arrangement. Additionally, conventional NAND flash memory is conveniently accessed serially, for example by sequentially accessing cells along the columns, rather than as a random access memory as in the case of NOR memory. NAND memory is thus especially well-suited for music and video storage applications Another important recent advance in the field of flash memory is referred to in the art as the multilevel program cell (MLC). According to this approach, more than two data states are made possible for each memory cell, simply by more finely controlling the programming of the cell. In conventional binary data storage, each memory cell is programmed into either a "0" or a "1" state. Reading of such binary cells is accomplished by applying a single control voltage to the control gate of the addressed memory cell so that the transistor conducts if programmed to a "1" state, but remains off in the "0" state; sensing of the conduction through the addressed memory cell thus returns the programmed state of the cell. In contrast, according to a typical example of the MLC approach, four possible states are defined for each memory cell, typically corresponding to binary values 00, 01, 10, 11. In effect, the two intermediate states correspond to two levels of partial programming of the cell between the fully erased and fully programmed states. Some implementations of MLC flash memory with up to eight possible states, or three binary bits, per cell are known. The ability to store two or three bits of data on each memory cell immediately doubles or triples the data capacity of a flash memory chip. Examples of MLC flash memory cells and memories including such MLC cells are described in U.S. Pat. No. 5,172,338, and U.S. Pat. No. 6,747,892 B2, both commonly assigned herewith and incorporated herein by this reference.

The combination of MLC technology with the efficiencies of NAND flash memory architectures has resulted in significantly reduced cost per bit for semiconductor non-volatile storage, as well as improved system reliability, and a higher data capacity and system functionality for a given form factor. However, despite these important improvements, the data transfer rates to and from conventional flash memory devices have not kept pace. Certain modern applications of flash memory are especially sensitive to data transfer rates, especially as the data capacity increases. For example, the resolution of high-performance, professional level, digital still cameras now can exceed 10 megapixels, for which the advances of MLC NAND flash memory technology are welcome. However, the "shutter lag" between successive image captures depends on the data transfer rate of the image data from the sensor into flash memory. This delay time between images (which, to the camera user, is considered as an independent parameter, not dependent on image resolution) is becoming a critical factor in these cameras. Especially as the image resolution continues to increase, it has been observed that conventional data transfer times are not adequate to achieve the desired delay time between images. Nor are the data transfer times into and out of conventional flash memory competitive with those of modern magnetic disk drives, which is of course another desirable new application for flash memory. Accordingly, in order for flash memory to meet the needs of modern high-performance digital still cameras, or to serve as solid-state mass storage in modern high-performance electronic systems, it will become necessary to achieve much higher data transfer rates to and from flash memory devices.

An example of a conventional data transfer approach for flash memories is described in the datasheet 2 GBIT (256M X 8 BITS) CMOS NAND E²PROM, part number TH58NVG1S3AFT05 (Toshiba, 2003). This conventional approach involves an eight-bit data bus, with one bit presented on each data output per cycle of a read enable clock, synchronous with the falling edge of that read enable clock. Also as described in that datasheet, this conventional approach involves a 3.3 volt logic standard, such that the minimum high logic level output voltage ($V_{OH}$) is 2.4 volts and the maximum low logic level output voltage ($V_{OL}$) is 0.4 volts. This device provides a maximum data rate of 20 MHz. It is believed that this data rate is not an adequate data rate for mass storage in personal computer systems, and as such these conventional flash memories would not be suitable for disk drive replacement.

By way of background, some conventional dynamic random access memories (RAMs) implement so-called "double data rate", or "DDR", data transfer techniques. As known in that art, DDR data transfer involves the transfer of one or more data bits (depending on the number of bus lines) synchronously with both the rising and falling edges of the corresponding data strobe, or clock. DDR data transfer thus communicates data at twice the data rate of conventional synchronous data transfer, which is synchronous with only one of the clock edges (rising or falling edge). In addition, conventional DDR dynamic RAMs utilize source-synchronous data strobes, in which the RAM device itself generates the data strobe for reads from the memory (while the external circuitry generates the data strobe for writes to the memory). However, this doubling of the input/output switching rate increases the power consumption of data transfer, approaching twice that of single-data rate communications.

Power consumption in modern electronic systems is a substantial concern, however, and the driving of buses and conductors in transferring data among integrated circuit devices in a system is a significant contributor to overall system power consumption. As is fundamental in the art, the power consumption of output driver circuits, for driving external conductors, relates directly to the switching rate of digital signals to be driven. Increasing the data transfer rate to approach those of modern magnetic disk drives, as mentioned above, thus will require a corresponding increase in the power consumed by such data transfer, keeping all other parameters equal. This increased power consumption requires larger driver and receiver devices, improved heat dissipation in system applications, and the like, all of which add cost to the overall system. Even if these changes are made, the increased power consumption from high-speed data transfer is undesirable for portable electronic systems, such as digital cameras, laptop computers and workstations, wireless telephone handsets, personal digital audio players, and similar battery-powered devices.

By way of further background, a communications protocol known as Ultra DMA Mode is known in the art, for communications to and from a flash memory card, such as a COMPACT FLASH, or CF+, flash memory card. FIG. 1 illustrates such a conventional flash memory card, constructed and operating according to the well-known standard CF+ and *CompactFlash Specification Revision* 3.0 (CompactFlash Association, 2004). As shown in FIG. 1, flash memory card 2, which in this example is constructed as a COMPACT FLASH storage card according to this standard, contains one or more flash memory modules 2, and single chip memory controller 4. Flash memory module 4 communicates data to and from memory controller 6 over bus data_I/O, and receives and issues control signals to and from memory controller 6 over control bus ctrl. In this example, the data transfer approach described in the above-referenced Toshiba datasheet corresponds to these communications over the data_I/O and ctrl buses between flash memory module 4 and memory controller 6. Memory controller 6 communicates with a host device (e.g., digital camera, digital audio player, personal computer, etc.) over host interface HOST_IF. The above-referenced CF+ and CompactFlash Specification describes communications over host interface HOST_IF, including according to the Ultra DMA Mode ("UDMA"). As described in that specification, UDMA communications are carried out in a special operating mode, initiated by the driving of a signal on a control line (UDMARQ) by the agent (host or memory card 2) that desires such communication. Also as described in that specification, UDMA data transfers are source-synchronous, in that the agent (memory card 2 or host system) that is placing the data onto bus HOST_IF is also issuing the data strobe signal. In addition, also as described in that specification, both rising and falling edges of the strobe signal are used in the transfer of data under the UDMA mode of operation.

However, it has been observed, in connection with this invention, that even with the UDMA mode for the host interface in the flash card of FIG. 1, the data transfer rate between the memory module 4 and memory controller 6 will limit the overall performance of memory card 2. However, the speeding up of data transfer at that interface according to conventional techniques will also greatly increase power consumption within memory card 2. In addition, it is known in the art that modification to input/output interfaces of memory integrated circuits will greatly limit the usability of such integrated circuits, adding cost from the standpoint of inventory control and design overhead.

By way of further background, other approaches toward improving the data transfer rate between a memory module and a memory controller, in the context of flash memory modules, are described in copending and commonly assigned application Ser. No. 11/379,895 filed Apr. 24, 2006, entitled "Method of High-Performance Flash Memory Data Transfer"; Ser. No. 11/379,910, filed Apr. 24, 2006, entitled "High-Performance Flash Memory Data Transfer"; Ser. No. 11/424, 573 filed Jun. 16, 2006, entitled "Method of High-Performance Flash Memory Data Transfer"; and Ser. No. 11/379,581 filed Jun. 16, 2006, entitled "High-Performance Flash Memory Data Transfer".

BRIEF SUMMARY OF THE INVENTION

It is therefore an object of this invention to provide a flash memory module having a high-performance data transfer mode, for data transfer to and from a memory controller.

It is a further object of this invention to provide such a module in which data transfer according to the high-performance mode consumes power at a rate that is not substantially greater than conventional data transfer.

It is a further object of this invention to provide such a module in which "legacy" data communications can also be carried out, to provide backward-compatibility with conventional data transfer standards.

It is a further object of this invention to provide such a module in which data skew in the high-performance data transfer mode is minimized.

Other objects and advantages of this invention will be apparent to those of ordinary skill in the art having reference to the following specification together with its drawings.

The present invention may be implemented into a flash memory device having a multiple-mode data interface. In a legacy mode, the data interface presents or receives data synchronously with an externally-generated data strobe, with one bit per conductor communicated in each cycle of the strobe. In a write operation in the legacy mode, a write enable strobe signal issued to the memory by a controller clocks each data word presented by the controller to the flash memory; in a read operation in this legacy mode, a read enable strobe signal issued to the memory by the controller clocks each data word presented by the flash memory to the controller. In an advanced mode, the data interface is source-synchronous, with a data bit or word synchronous with strobe edges of both of the read and write enable strobes. In a read operation in the advanced mode, the flash memory device issues the read and write strobes, at differing phase from one another, to clock alternating output data words. In a write operation in this advanced mode, the controller issues the read and write strobes, at differing phase from one another, to clock alternating input data words into the memory. A reduced voltage swing is provided for the advanced mode, to reduce power consumption. Upon invocation of the advanced mode for data transfers, the legacy operating mode continues to be used for command and control communications; data time-out and other automated control functions are provided for the advanced operating mode.

BRIEF DESCRIPTION OF THE SEVERAL VIEWS OF THE DRAWING

FIGS. 4a through 4d are timing diagrams illustrating the operation of the flash memory module of FIGS. 2 and 3 in a normal operating mode, and in the communication of commands, according to the preferred embodiment of the invention.

FIGS. 5a and 5b are flow diagrams illustrating the operation of advanced mode read data transfers and write data transfers, respectively, according to a first preferred embodiment of the invention.

FIGS. 6a through 6e are timing diagrams illustrating signals involved in the operations of FIGS. 5a and 5b according to the preferred embodiment of the invention.

DETAILED DESCRIPTION OF THE INVENTION

The present invention will be described in connection with its preferred embodiment, namely as implemented into a flash memory module, and a subsystem including such a flash memory module, and method of operating the same. More specifically, this exemplary flash memory module is described as a multi-level cell (MLC) flash memory of the NAND type, as it is contemplated that this invention will be particularly useful in connection with such flash memories, in order to enable the use of solid-state non-volatile memory for mass data storage in computer systems. However, it is contemplated that this invention will be useful and beneficial in other applications involving non-volatile solid-state memories of various types. Accordingly, it is to be understood that the following description is provided by way of example only, and is not intended to limit the true scope of this invention as claimed.

Figure 1:
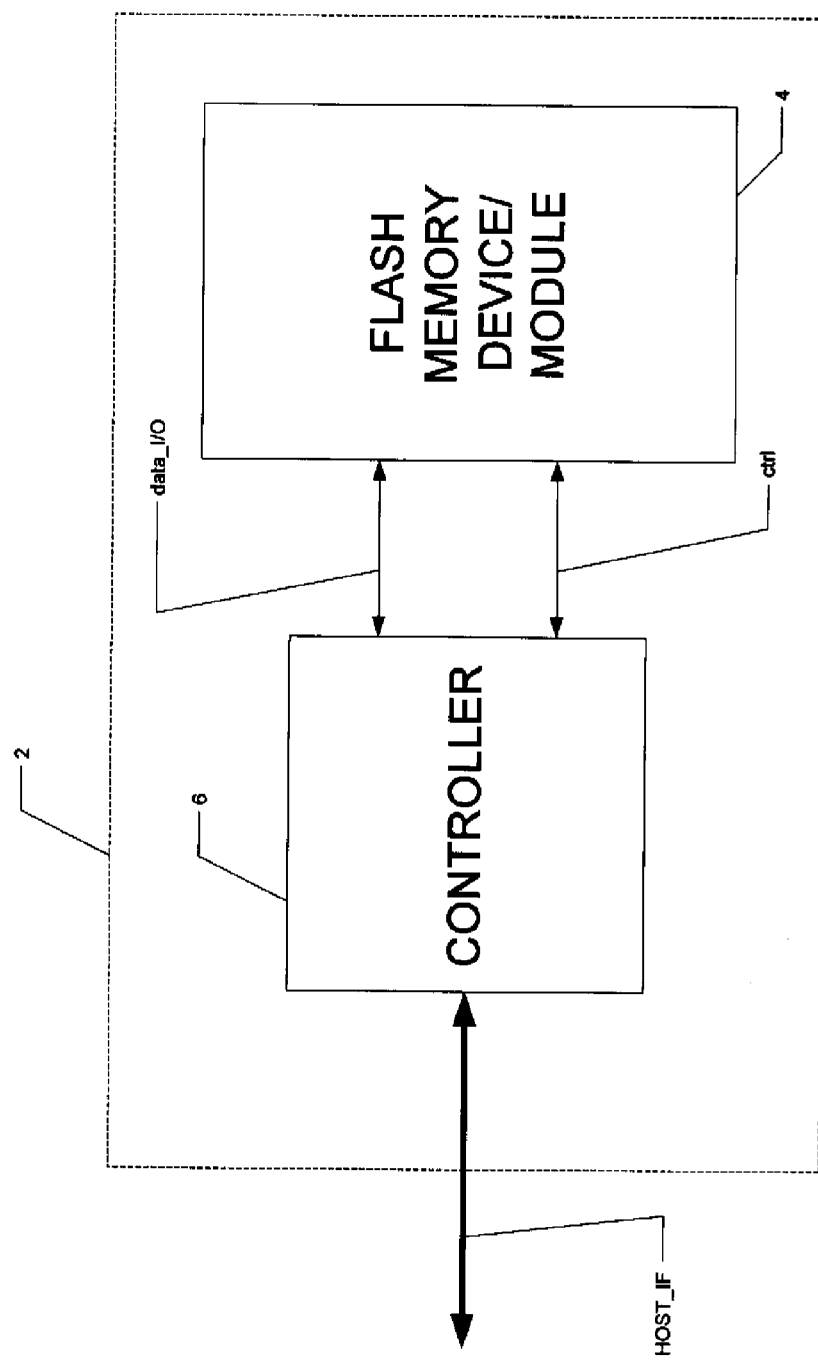
FIG. 1 is an electrical diagram, in block form, of a conventional memory card.
Figure 2:
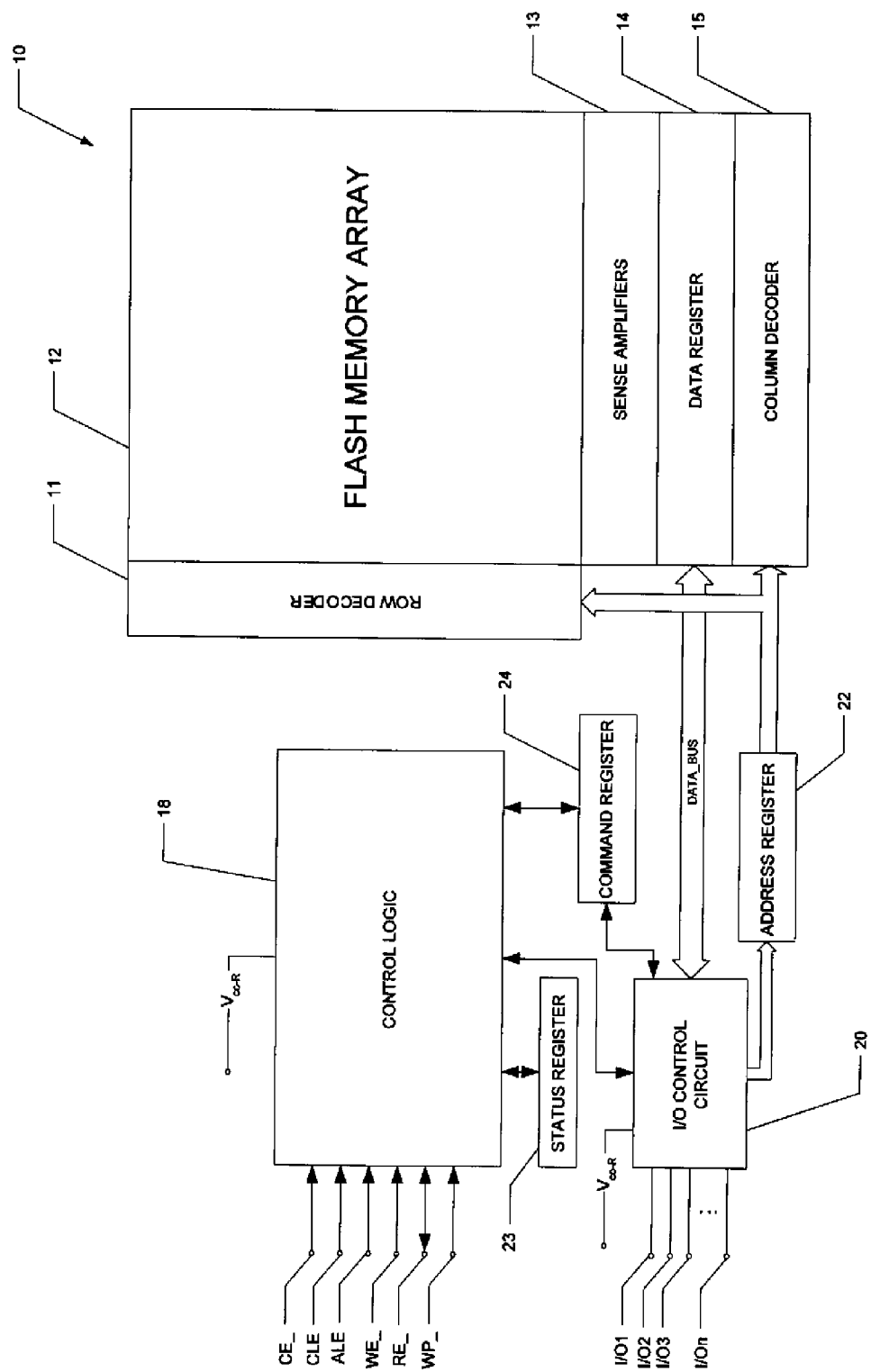
FIG. 2 is an electrical diagram, in block form, of a memory module constructed according to the preferred embodiment of the invention.

FIG. 2 illustrates an exemplary construction of flash memory device (or module) 10 constructed according to a preferred embodiment of the invention. It is contemplated that flash memory device 10 will typically be constructed into a single integrated circuit, and as such may be interfaced with any one of a number of memory controllers or memory controller logic, as will be described in further detail below. It is also contemplated that the architecture of flash memory device 10 illustrated in FIG. 2 is merely an example presented for purposes of comprehending this invention, and that those skilled in the art having reference to this specification can readily realize this invention in connection with flash memory devices of architectures varying from that shown in FIG. 2.

The storage capability of flash memory device 10 resides in flash memory array 12. Array 12 includes electrically programmable and erasable memory cells arranged in rows and columns, as known in the art. While a single array 12 is shown in FIG. 2, it is of course contemplated that array 12 may be realized as multiple sub-arrays, each having a separate instance of peripheral circuitry, such as part or all of the address, data, or control circuitry described in further detail below relative to the example of FIG. 2. It is contemplated that those skilled in the art having reference to this specification will be readily able to realize this invention in connection with such multiple sub-array architectures. In this example, the memory cells of array 12 are floating-gate metal-oxide-semiconductor (MOS) transistors, constructed so that each such transistor, corresponding to one memory cell, can be electrically programmed and also electrically erased. According to the preferred embodiment of the invention, the memory cells of array 12 are multi-level cells (MLC), in that they may be programmed to more than two data states (i.e., to any of more than two threshold voltages), so that each such cell stores a multiple-bit digital value. Also according to this preferred embodiment of the invention, as will be evident from the following description, these memory cells are preferably arranged in the well-known NAND fashion, such that the cells are typically not randomly accessed but are rather accessed serially, as useful for mass storage applications. Of course, this invention may also be used in connection with binary memory cells (i.e., storing only a single digital bit), and in connection with NOR arrangements of the memory cells.

According to this preferred embodiment of the invention, common input/output terminals I/O1 through I/On are provided, and connected to input/output control circuit 20. As known in the art for NAND type flash memories, the operation of flash memory device 10 is controlled in large part by the receipt and execution of commands, communicated as digital words over input/output terminals I/O1 through I/On, and executed by control logic 18. As such, input/output control circuit 20 receives control commands, address values, and input data, and presents status information and output data, via its driver and receiver circuitry that communicate with input/output terminals I/O1 through I/On. It is contemplated that the number n of input/output terminals I/O1 through I/On will generally be eight or sixteen, although, of course, any number of such terminals may be provided. In addition, input/output control circuit 20 receives power supply voltage $V_{cc-R}$ and drives input/output terminals I/O1 through I/On with logic levels based upon that voltage. According to this preferred embodiment of the invention as will be described in detail below, this power supply voltage $V_{cc-R}$ is at a lower voltage than that used in conventional flash memory devices, so that the power consumption resulting from data transfers at input/output terminals I/O1 through I/On is reduced, even at higher switching rates. Control logic 18 also receives this power supply voltage $V_{cc-R}$ based upon which it will drive output control signals at the lower voltages from read enable terminal RE_, among others.

Input/output control circuit 20 forwards command information to command register 24, for decoding and execution by control logic 18, as it controls the operation of flash memory device 10. Status information is stored by control logic 18 in status register 23, in the conventional manner. Address values received at input/output terminals I/O1 through I/On by input/output control circuit 20 are buffered in address register 22; the row portion of such addresses is decoded by row decoder 11 and the column portion is decoded by column decoder 15 (each of which typically includes an address buffer), to effect selection of the desired cell or cells in array 12, in the conventional manner. Input/output control circuit 20 is also in bidirectional communication with data register 14, via bus DATA_BUS, to forward data to be written to data register 14, and to receive output data from data register 14, depending upon the direction of the data transfer to be executed. Control logic 18 also receives various direct control signals from external to flash memory device 12, including, for example, lines for the signals of chip enable CE_, command latch enable CLE, address latch enable ALE, write enable WE_, read enable RE_, and write protect line WP_. As known in the art, the command latch enable CLE and address latch enable ALE signals indicate whether a command or address is being presented on input/output terminals I/O1 through I/On, while the write enable WE_ and read enable RE_ signals serve as the data strobes in write and read operations, respectively.

According to this embodiment of the invention, and as will be described in further detail below, both of the read enable RE_ signal and the write enable WE_ signal are bidirectional. For read operations in a normal operating mode, the external device that is the destination of data being read from flash memory array 12 is the source of the read data strobe, which is then conveyed as an input to flash memory device 10 as the read enable RE_ signal. Write operations, in this normal operating mode, the external device that is providing the input data sources the write data strobe as the write enable WE_ signal, synchronously with the placing of the input data at input terminals I/O1 through I/On. In read operations in an advanced operating mode according to the preferred embodiment of the invention, as will be described in further detail below, control logic 18 issues two read data strobes, phase-shifted from one another, with one of the read data strobes being the read enable RE_ signal and the other being the write enable WE_ signal. An edge, or transition, of each of these signals will be synchronous with data read from flash memory array 12 and communicated via data register 14, I/O control circuit 20 and input/output terminals I/O1 through I/On. Similarly, write operations will be carried out in the advanced operating mode by using both the read enable RE_ signal and the write enable WE_ signal as write data strobes, issued by the data source to flash memory device 10.

Figure 3:
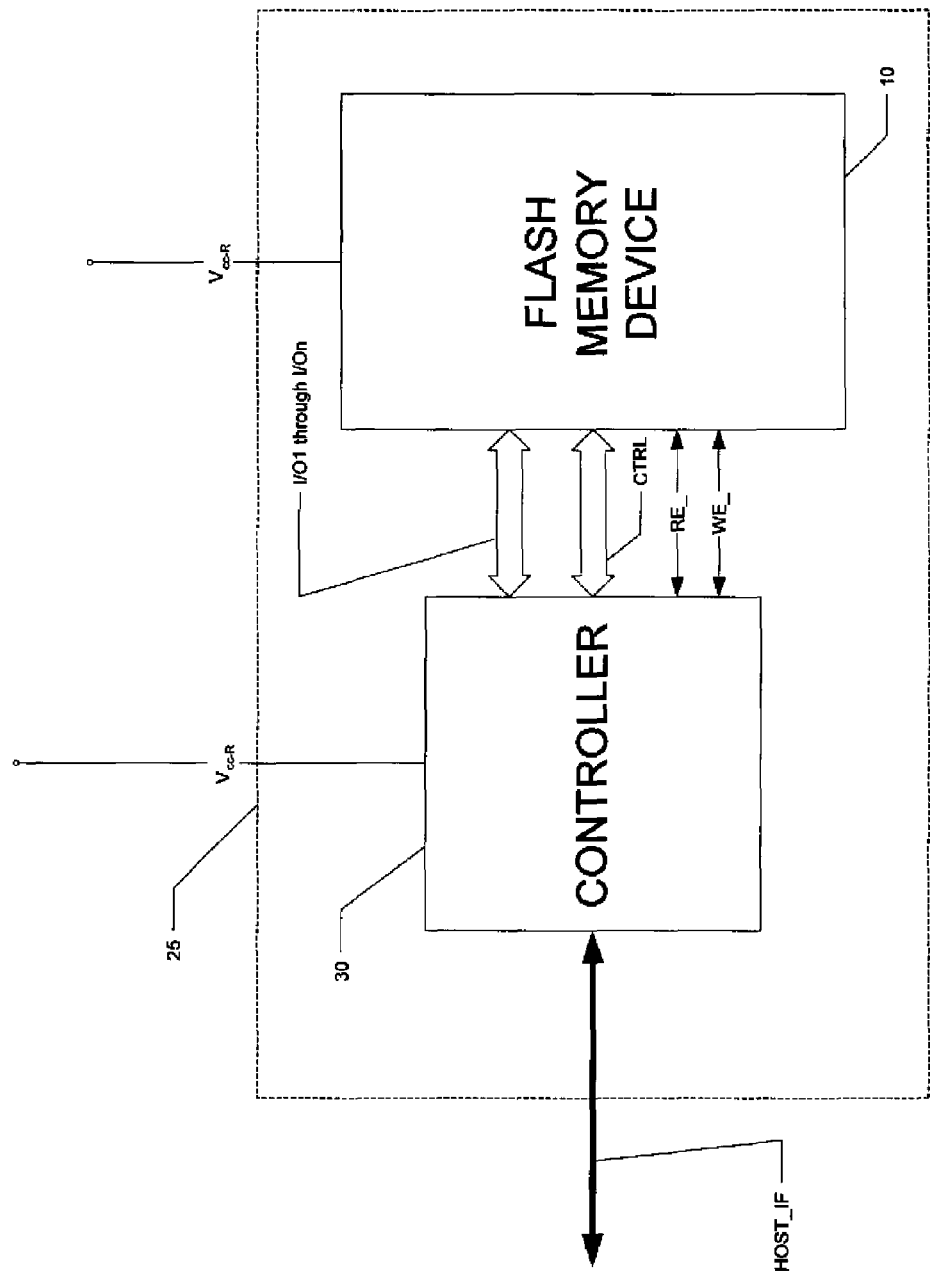
FIG. 3 is an electrical diagram, in block form, of the memory module of FIG. 2 implemented into a system or subsystem in combination with a single-chip memory controller, according to the preferred embodiment of the invention.

FIG. 3 illustrates an implementation of flash memory device (or module) 10 into flash memory card 25, according to a preferred embodiment of the invention. As shown in FIG. 3, flash memory card 25 includes at least flash memory device 10 itself and also controller 30. Controller 30 provides and manages an external interface HOST_IF to a host system, such as a high-performance digital camera, a personal computer, or a portable device such as a digital audio player or cellular telephone handset or the like; interface HOST_IF may also correspond to a set of external terminals of flash memory card 25 constructed as a general purpose card that may be inserted into any one of a wide range of host systems, as known in the art. It is contemplated that interface HOST_IF may operate according to a conventional standard interface as known in the art currently, or as may be developed in connection with future flash memory interface standards or proprietary interface protocols. As mentioned above, it is contemplated that this invention will be especially beneficial in providing high speed data transfer, such as in the data transfer rate critical application of a high-performance digital still camera. It is further contemplated that the high data transfer rates provided by this invention can also enable the use of flash memory as a solid-state mass storage device in a personal computer, replacing magnetic disk drives. As such, it is contemplated that interface HOST_IF will best have high-speed data transfer capability, for example as contemplated by the UDMA standard mentioned above in the Background of the Invention.

As shown in FIG. 3, flash memory device 10 is coupled to controller 30 in a manner consistently with the terminals shown in FIG. 2. In this regard, an input/output bus is formed by signal lines I/O1 through I/On, corresponding to similarly named terminals of flash memory device 10. A control bus CTRL couples controller 30 to flash memory device 10, and includes signal lines connected to the ALE, CLE, WP_, and CE_ terminals shown in FIG. 2. It is contemplated that other control lines and terminals may also be provided for communication between flash memory device 10 and controller 30, and as such control bus CTRL is illustrated as a bidirectional bus, even though the ALE, CLE, WP_, and CE_ terminals are shown in FIG. 2 as inputs to flash memory device 10.

FIG. 3 illustrates two control lines, RE_ and WE_, separately from control bus CTRL, for the sake of clarity of this description. According to this embodiment of the invention, line WE_ carries the data strobe in legacy mode write operations (data written from controller 30 to flash memory device 10), and as such is connected to terminal WE_ of flash memory device (FIG. 2). However, according to this preferred embodiment of the invention, the data strobe on line WE_ is bidirectional, in that it is sourced by controller 30 for write operations in the legacy and advanced modes, and that it is sourced by flash memory device 10 in advanced mode read operations, as will be described below. In a general sense, according to the preferred embodiments of this invention, control line WE_ is involved in both read and write operations in the advanced data transfer mode, to provide a second phase-shifted strobe signal that is used to strobe alternating data words in both read and write operations.

Line RE_ carries the data strobe for legacy mode read operations (data read from flash memory 10 and communicated to controller 30), and as such is connected to terminal RE_ of flash memory device 10 (FIG. 2). As mentioned above, according to this preferred embodiment of the invention, line RE_ is bidirectional, with the source of the read data strobe depending on the current operating mode of flash memory device 10. In a normal operating mode, controller 30 sources the read data strobe, in response to which flash memory device 10 maintains as valid data it presents on signal lines I/O1 through I/On. In an advanced operating mode according to the preferred embodiment of the invention, flash memory device 10 sources the read data strobe on line RE_ for data transfer from flash memory device 10 to controller 30. And as will also be described in detail below, controller 30 will also strobe line RE_ during advanced mode write operations. Therefore, similarly as line WE_, control line RE_ is involved in both read and write operations in the advanced data transfer mode according to the preferred embodiments of this invention, to provide a second phase-shifted strobe signal that is used to strobe alternating data words in both read and write operations.

As will be described in further detail below, commands communicated by controller 30 over signal lines I/O1 through I/On are synchronous with a read data strobe source on signal line RE_, regardless of the operating mode in which flash memory device 10 is transferring data to controller 30.

It is contemplated that controller 30 will be constructed substantially according to conventional flash memory controller architectures, as known in the art, modified as necessary to effect the operations described in this specification in connection with the initiation, operation, and termination of read operations in the advanced operating mode of flash memory device 10 according to the preferred embodiment of the invention. It is also contemplated that the logic hardware, program instructions, or combination thereof for implementing these advanced operating mode functions within controller 30 will be apparent to those skilled in the art having reference to this specification. As such, it is further contemplated that those skilled readers will be readily able to implement such modifications of controller 30, as best appropriate for a particular realization, without undue experimentation.

And, also as shown in FIG. 3, power supply voltage $V_{cc-R}$ is connected to, and biases, each of flash memory device 10 and controller 25. This power supply voltage $V_{cc-R}$ is at a lower voltage than that used in conventional flash memory devices and controllers, so that the power consumption resulting from data transfers and transitions over input/output lines I/O1 through I/On and the various control lines is reduced, even at higher switching rates as will be described below. As will be discussed in further detail below in connection with a particular example, this power supply voltage may be at a nominal voltage of about 1.80 volts, within a range from about 1.60 volts to about 2.00 volts, which is substantially lower than the conventional standard nominal power supply voltage of 3.30 volts, within a specification range of between 2.70 volts and 3.60 volts.

Referring now to FIGS. 4a through 4e, the operation of flash memory device 10 in combination with controller 30 in memory card 25, according to a normal operating mode and also a command communication mode, will now be described. It is contemplated that these operating modes will substantially correspond to conventional flash memory interface protocols for modern flash memory devices, and as such these operating modes will serve as a "legacy" input/output protocol for flash memory device 10 according to the preferred embodiment of the invention.

Figure 4A:
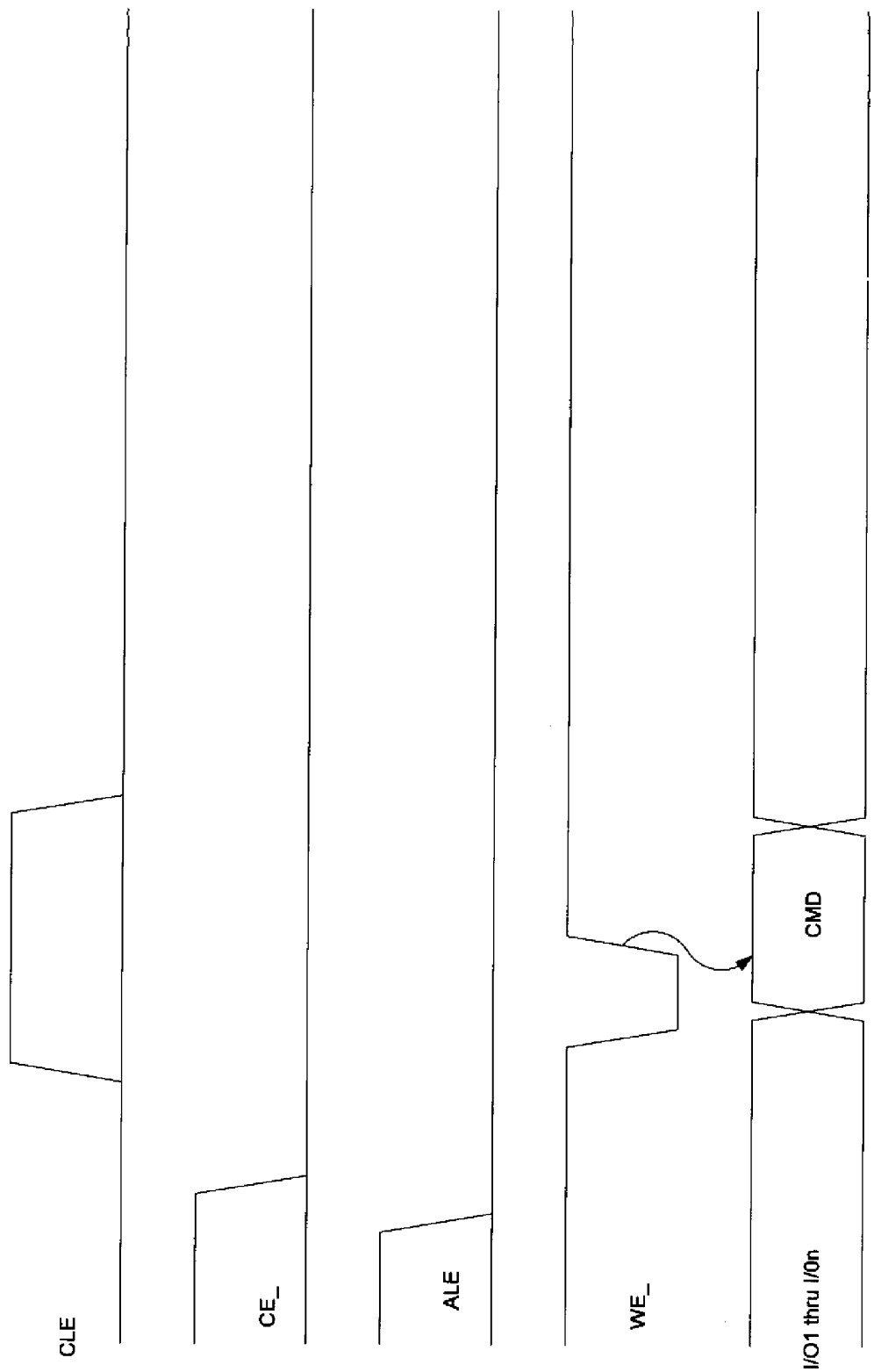

FIG. 4a illustrates the communication of a command from controller 30 to flash memory device 10. As known in the art, and as will be described in further detail below, modern flash memory devices operate in response to specific commands that are issued by a controller, and that are communicated over the data input/output lines. As such, in this example, the communication of a command CMD is effected by controller 30 driving command latch enable signal CLE to a high active state, and address latch enable signal ALE to a low inactive state, signifying that a command, rather than an address, will be communicated on input/output lines I/O1 through I/On. Chip enable signal CE_ is taken active low, enabling flash memory device 10 in the conventional manner; as known in the art, if multiple flash memory devices 10 are provided within card 25, individual chip enable signals CE_ can be used by controller 30 as it selects the desired one of the flash memory devices 10 for communication. The digital word presented by controller 30 on input/output lines I/O1 through I/On, corresponding to command CMD as shown in FIG. 4a, is strobed by controller 30 issuing an active low pulse on write enable line WE_; the rising edge of the pulse on line WE_ causes I/O control circuit 20 to receive and latch in the command CMD, eventually reaching command register 24 (FIG. 2). Controller 30 can then return the command latch enable signal CLE to an inactive low state, terminating the command operation. Of course, as known in the art, multiple word commands, or multiple single-word commands, can be communicated sequentially in this manner, with command latch enable line CLE held high for the duration of such communications.

Figure 4B:
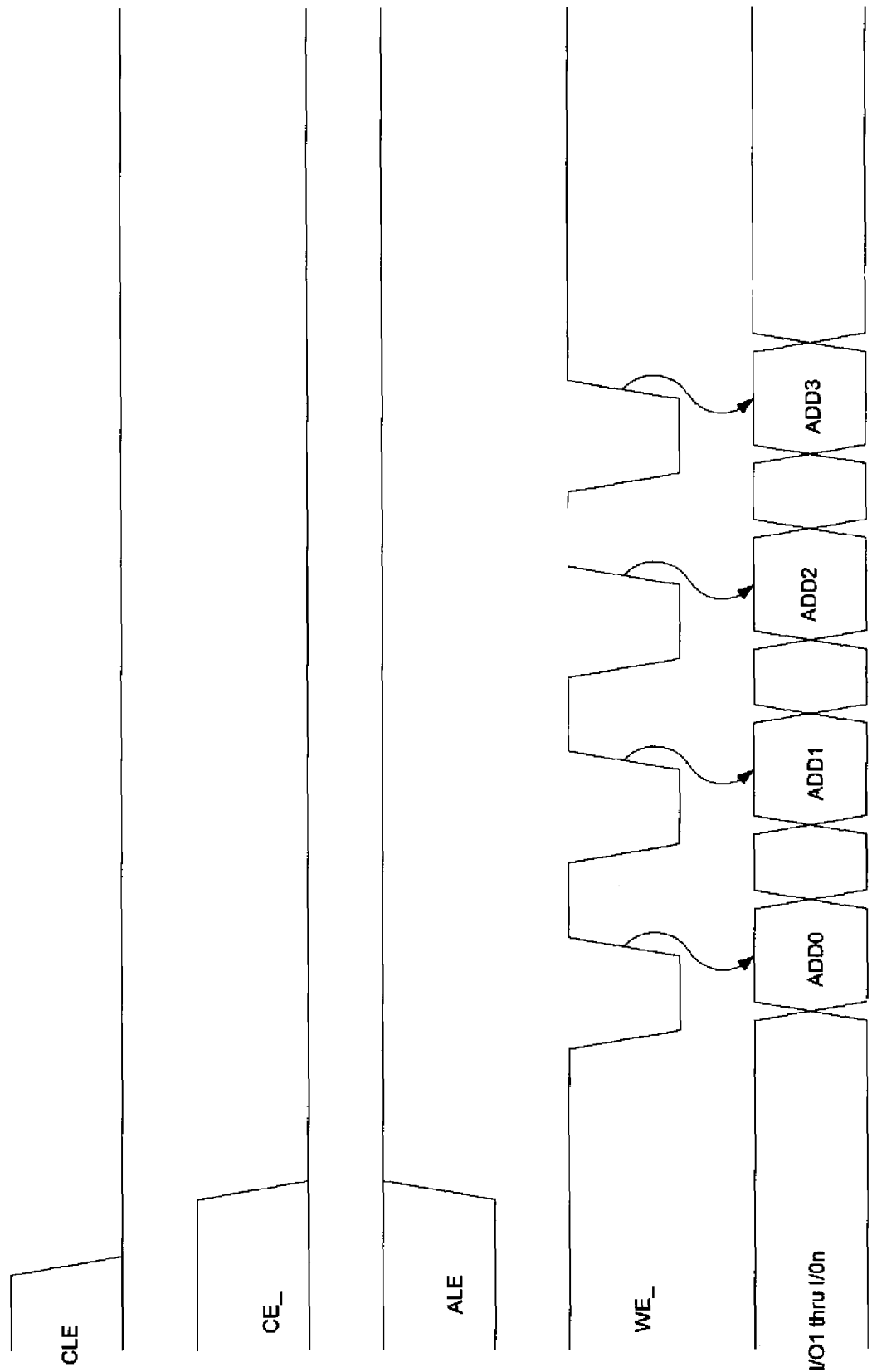

One command that is communicated in the manner illustrated in FIG. 4a is a command (e.g., command 00H for a read operation; command 10H for a serial data input program, or write, operation) indicating that a memory address will be communicated by controller 30 to flash memory device 10. FIG. 4b illustrates the timing of the communication of such an address by controller 30 to flash memory device, in a normal and command operating mode according to the preferred embodiment of the invention. As such, the operation illustrated in FIG. 4b follows the communication of a command 00H, according to the sequence of FIG. 4a, indicating the imminent transmission of a memory address in the next signal sequence.

A relatively wide range of commands can be communicated by controller 30 to flash memory device 10 in this normal operating mode. The following table lists an exemplary command set in this preferred embodiment of the invention:

| Command | Command code (hexadecimal) |
| --- | --- |
| Serial data input | 80 |
| Auto program | 10 |
| Read address input | 00 |
| Column address change during serial data output | 05 |
| Read start | 30 |
| Read column address change | E0 |
| Auto block erase | 60, D0 (two cycle command) |
| ID read | 90 |
| Status read | 70 |
| Reset | FF |

Referring now to FIG. 4b, the transmission of a memory address from controller 30 to flash memory device 10 according to this preferred embodiment of the invention will be described. In this operation, controller 30 drives command latch enable signal CLE inactive low, and drives address latch enable signal ALE high, indicating to flash memory device 10 that an address value will be communicated (rather than a command value) on input/output lines I/O1 through I/On. The chip enable signal CE_ is also driven active low, indicating that controller 30 is selecting flash memory device 10 as the recipient of this address information. In this operation, controller 30 issues active low pulses of the write enable signal WE_, each pulse indicating a portion of the address value then presented by controller 30 on input/output lines I/O1 through I/On. In this embodiment of the invention, this address information is synchronous with the rising edge (i.e., end of the active low pulse) of write enable signal WE_, such that flash memory 10 can use this edge to latch the then-current state of input/output lines I/O1 through I/On into address register 22 (FIG. 2) as a portion of the desired memory address. As evident in the example of FIG. 4b, the memory address extends over multiple words (the width of which is defined by the number n of input/output lines I/O1 through I/On). In this case, the memory address includes four address words ADD0 through ADD3 that are presented synchronously with successive active low pulses of write enable signal WE_.

Figure 4C:
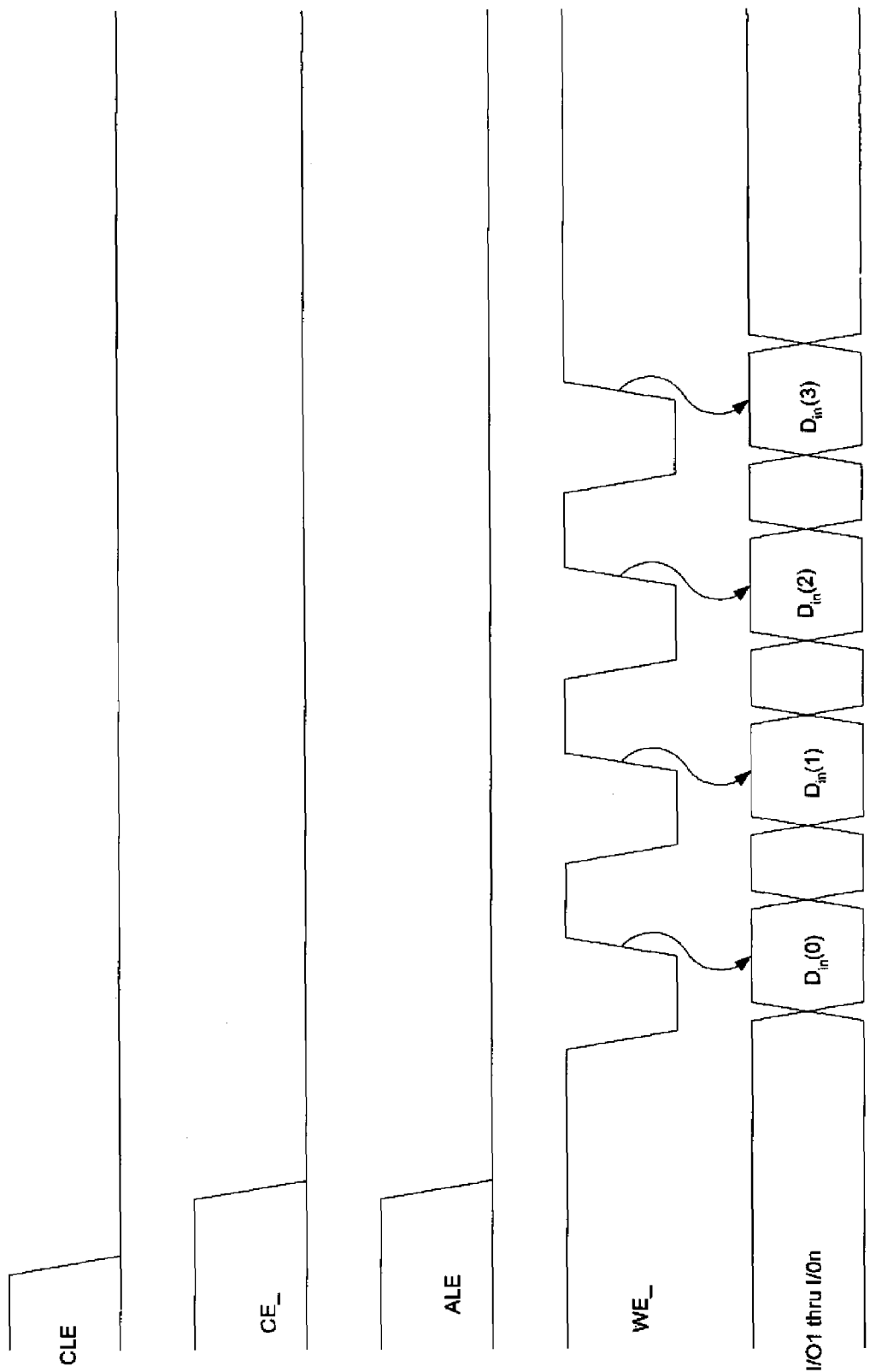

Following the communication of an address value as shown in FIG. 4b, controller 30 can effect a write of data to flash memory device 10, or a read of data therefrom. FIG. 4c illustrates the signals communicated to effect a write operation, according to this preferred embodiment of the invention, and in a normal operating mode (i.e., a "legacy" mode). According to the architecture of FIG. 2, this data write operation is a write of data to data register 14. As such, according to the preferred embodiment of the invention, a write to data register command (e.g., command value 80H) is effected, in the manner shown in FIG. 4a, following which the destination memory address within flash memory device 10 is communicated by controller 30, both prior to the write operation to now be descried relative to FIG. 4c. To effect a data write operation, controller 30 drives command latch enable signal CLE and address latch enable signal ALE both inactive low, indicating to flash memory device 10 that input data to be written (i.e., neither a command nor an address value) will be communicated on input/output lines I/O 1 through I/On. Of course, chip enable signal CE_ is also driven active low for this operation. Controller 30 then issues active low pulses of the write enable signal WE_ along with each byte or word of data presented on input/output lines I/O1 through I/On. In this embodiment of the invention, as in the case of command and address transmissions, the valid input data is presented synchronous with the rising edge of write enable signal WE_ at the end of each pulse. In response to this edge, flash memory device 10 latches the then-current state of input/output lines I/O1 through I/On, corresponding to a word or byte of input data, either into data latch within I/O control circuit 20, or directly (or eventually, as the case may be) over bus DATA_BUS to data register 14. FIG. 4c illustrates the communication of four words $D_{in}(0)$ through $D_{in}(3)$ over input/output lines I/O 1 through I/On, synchronous with four pulses of write enable signal. WE_.

FIG. 4d illustrates the operation of controller 30 and flash memory device 10 in carrying out a data read operation (from flash memory device 10 to controller 30) in a normal operating ("legacy") mode according to the preferred embodiment of the invention. As in the case of a data write operation, a command sequence (e.g., as shown in FIG. 4a) and an address sequence (e.g., as shown in FIG. 4b) has previously been carried out prior to this read operation. One or more write operations may also have been previously carried out before this read (i.e., in which case, if the read is to the same address as has just been written, this read would serve as a verify of the previous write), or a write operation (e.g., as shown in FIG. 4c) may be performed after this read operation, in the form of a read-modify-write sequence to the same memory address. In response to the communication of an address prior to a read, the contents of the memory cells corresponding to that address are sensed, and forwarded to data register 14. As such, the read operation of FIG. 4d is a read of the current comments of data register 14. And in order to effect this read operation, controller 30 issues the appropriate command (e.g., command E0h) in a command operation in the manner described above relative to FIG. 4a.

In this operation, as in the data write operation, controller 30 has driven command latch enable signal CLE and address latch enable signal ALE both inactive low, and has driven chip enable signal CE_ active low. Controller 30 indicates a desired read operation by taking write enable signal WE_ inactive high. In this data read operation, flash memory device 10 outputs data words $D_{out}$ in response to falling edges of active low pulses of read enable signal RE_, as generated by controller 30. In this normal operating mode, therefore, controller 30 is able to synchronize the receipt of data from flash memory device 10 by issuing an active low pulse of read enable signal RE_, and then waiting a specified access time (permitting flash memory device 10 to effect some or all of the operations involved in sensing the states of its memory cells, and in forwarding the sensed states to its data register 14 and out to input/output lines I/O1 through I/On. Controller 30 can then latch into its input buffer the data states of input/output lines I/O1 through I/On to receive the data from flash memory device 10. In the example of FIG. 4d, four data words $D_{out}(0)$ through $D_{out}(3)$ are read in sequence; a rising edge of chip enable signal CE_ ends this read operation, following which flash memory device 10 causes its output drivers in I/O control circuit 20 to place input/output terminals I/O1 through I/On into a high-impedance ("high-Z") state.

Other operations according to this normal operating ("legacy") mode are also preferably available, such operations as known in the art. For example, controller 30 can read the contents of status register 24 in this normal operating mode by issuing a specific status command (e.g., command code 70H) following the timing of FIG. 4a, and receiving the contents of status register 24 over input/output lines I/O1 through I/On in response to its issuing of an active low pulse of read enable signal RE_.

As evident from FIGS. 4c and 4d, one data word or byte (referred to as "data word" in the following description) is communicated for each cycle of write enable signal WE_ or read enable signal RE_, as the case may be. And as evident from these Figures and the foregoing description, controller 30 controls and sources both the write enable signal WE_ and the read enable signal RE_ in this normal operating mode. In the read operation, particularly, because only one data word is read for each complete cycle of read enable signal RE_, controller 30 has sufficient time, according to conventional flash memory timing requirements and performance, to itself issue its read data strobe (read enable signal WE_) and to receive and latch the read data. However, this level of performance may not necessarily be sufficient for high-speed use of flash memory device 10, such as when flash memory card 25 is used as mass data storage in a computer system. In addition, it is contemplated that this "legacy" mode of operation may not be able to keep up with the high speed external interface mode from controller 30 to the host system, such as under the UDMA interface protocol mentioned above.

Figure 5B:
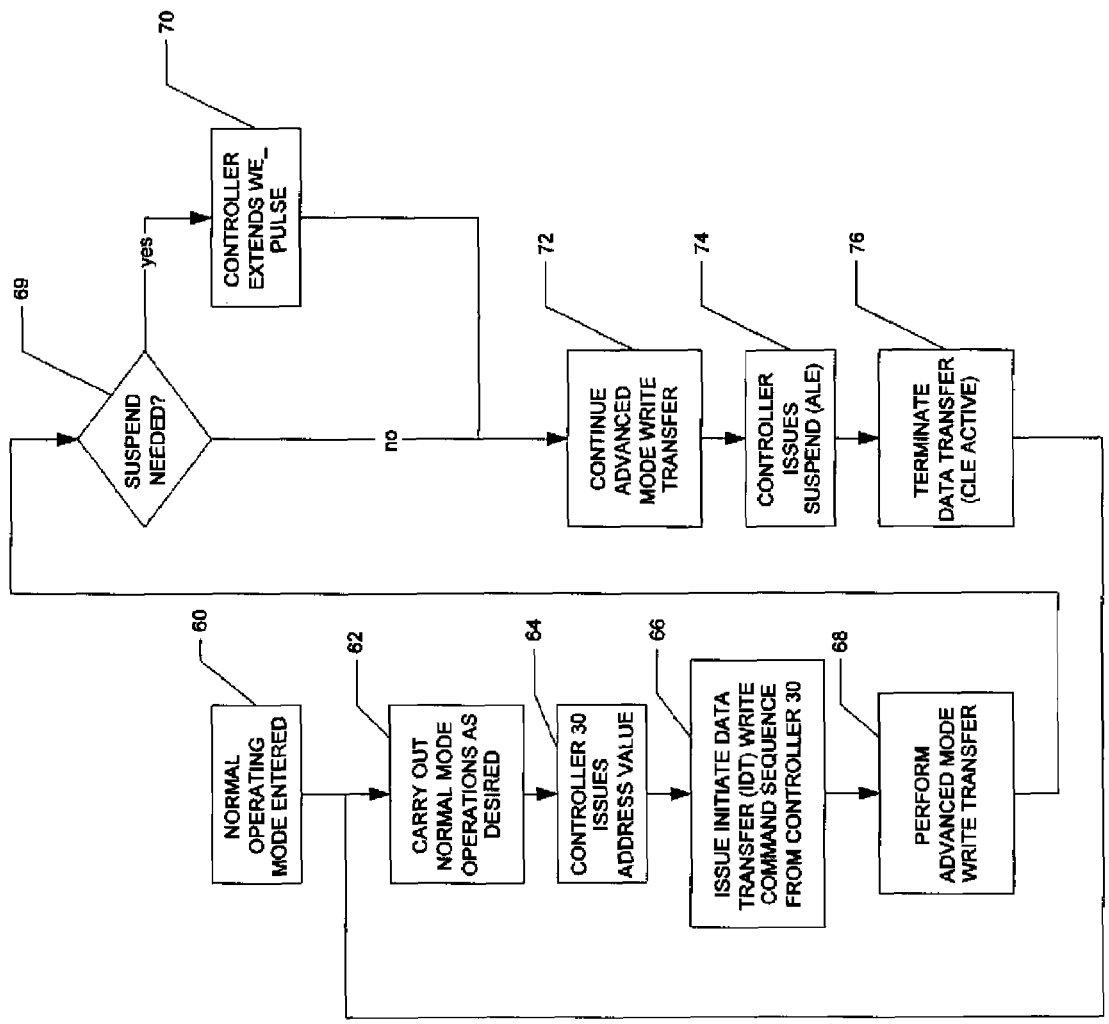

According to the preferred embodiment of the invention, therefore, flash memory device 10 provides an advanced, higher performance, read and write operating mode, and controller 30 is constructed to take advantage of that advanced mode. The operation of flash memory device 10 and controller 30 in utilizing this advanced mode will now be described in detail, in connection with the flow diagrams of FIGS. 5a and 5b, and the timing diagrams of FIGS. 6a through 6e.

FIGS. 5a and 6a through 6c illustrate the operation of flash memory device 10 in performing a data read operation (i.e., from flash memory device 10 to controller 30, in flash memory card 25). In process 40 of FIG. 5a, flash memory device 10 and controller 30 are powered-up, which places both of these devices into the normal operating mode (process 42), as described above relative to FIGS. 4a through 4d. In process 44, read and write operations (if any) in this normal mode are carried out in this normal operating ("legacy") mode.

Entry into the advanced read operating mode begins with process 46, in which controller 30 issues a memory address value to flash memory device 10 according to the normal operating mode, as described above relative to FIG. 4b. The memory address issued by controller 30 in process 46 is the initial memory address from which data will be read in this advanced operating mode, and preferably follows the transmission of the corresponding read address input command as described above. In process 48, controller 30 issues an "initiate data transfer", or "IDT", command sequence to flash memory device 10. FIG. 6a illustrates this operation in further detail.

According to the preferred embodiment of the invention, an "IDT read" command is issued by controller 30 to flash memory device 10 to initiate the advanced data transfer mode in process 48. This command is issued in a similar manner as the issuing of commands described above relative to FIG. 4a, with controller 30 driving chip enable signal CE_ active low, address latch enable signal ALE inactive low, and command latch enable signal CLE active high. The rising edge of an active low pulse of write enable signal WE_ serves as the data strobe for the IDT command value IDT_RD_CMD (which is a binary word having a value different from other assigned command values) driven onto input/output lines I/O1 through I/On by controller 30. After a specified time following write enable signal WE_ being taken high, controller 30 places input/output lines I/O1 through I/On into a high-impedance state. And, after another elapsed time $t_{rel}$ following the rising edge of the write enable signal WE_, when strobing in the IDT read command, controller 30 then also releases control of its read enable signal RE_, permitting control logic 18 of flash memory device 10 to drive the state of corresponding lines RE_ and WE_ (without risking data contention with controller 30). According to this preferred embodiment of the invention, the direction of the advanced mode data transfer (i.e., either a write or a read) is established by the value of the IDT command upon entry into the advanced data transfer mode, which permits both of the read enable RE_ and write enable WE_ signals to be used in the data transfer itself, as will be described below.

Alternatively, the entry into the advanced data transfer mode, and the indication of whether a read or write operation in this mode is to be carried out, may be communicated from controller 30 to flash memory device 10 in other ways. For example, a particular sequence of transitions of control signals (e.g., on one or more of the lines of control bus CTRL including one or more of the signal lines connected to the ALE, CLE, WP_, and CE_ lines, along with the read enable RE_ and write enable WE_ signals). It is contemplated that these and other alternative approaches to entering the advanced data transfer mode, either or both for read and write operations, will be apparent to those skilled in the art having reference to this description Once the IDT read command has been latched into and executed by flash memory device 10, flash memory device 10 then begins executing a high-speed mode read data transfer process 50. As shown in FIG. 6a, this read data transfer process begins with flash memory device 10 issuing the first valid output data word $D_{out}(0)$, following the elapse of a non-zero access time after the rising edge of write enable signal WE_. Once it presents this first output data word $D_{out}(0)$, flash memory device 10 then begins issuing active pulses of both read enable signal RE_ and write enable signal WE_, synchronous with alternating ones of additional output data words $D_{out}(1)$ et seq. According to this preferred embodiment of the invention, read enable signal RE_ and write enable signal WE_ are out-of-phase with one another, with the same edge of each (e.g., falling edge in this example, although of course rising edges may alternatively be used) clocking a corresponding data word. As shown in FIG. 6a, write enable signal WE_ is 180° out of phase with read enable signal RE_ in this advanced mode read operation. This complementary phase relationship is not essential for this operation according to this preferred embodiment of the invention, because the strobing of output data words will occur upon the next alternate falling edge, whenever it occurs; however, the complementary phase relationship is desirable to maximize the data transfer rate at the fastest specified level. As shown in FIG. 6a, one data word $D_{out}(k)$ is issued synchronously with each falling edge of the read enable signal RE_ and write enable signal WE_ driven by flash memory device 10 itself. In the example of FIG. 6a, each output data word $D_{out}(k)$ follows its corresponding strobe edge by a non-zero access time; alternatively, each read enable signal RE_ and write enable signal WE_ falling edge may be issued (or delayed to be issued) to controller 30 within its corresponding valid data word $D_{out}(k)$.

According to the preferred embodiment of the invention, therefore, the rate at which flash memory device 10 presents data to controller 30 via input/output lines I/O1 through I/On, in this advanced mode, is substantially faster than the data rate in the normal operating mode (FIG. 4d), approaching twice the data rate in typical realizations. This higher data rate is in part enabled by permitting flash memory device 10 to issue the read data strobe edges of read enable signal RE_ and write enable signal WE_, which eliminates the propagation delay and necessary timing windows that would be involved if controller 30 were issuing these read data strobe edges. In addition, the frequency of falling strobe edges for these two signals can approach twice that of a single signal. The write enable signal WE_ is available for use in this read operation, because the direction of the data transfer is set by the IDT read command value.

As will be apparent to those skilled in the art, however, the increased rate at which output data is presented on input/output lines I/O1 through I/On, with all other factors equal, substantially increases the power dissipation within flash memory card 25, primarily from the output drive circuit within I/O control circuit 20 of flash memory device 10 in this read operation. This power consumption is exacerbated as the data word width (i.e., the number n of input/output lines I/O1 through I/On) increase, as is the modern trend. According to the preferred embodiment of the invention, this power consumption is greatly reduced by reducing the voltage swing of the output signals on input/output lines I/O1 through I/On as will now be described.

Conventional flash memory devices utilize the well-known 3.3 volt bus standard, in which the minimum high level output voltage $V_{OH}$ is 2.4 volts and the maximum low level output voltage $V_{OL}$ is 0.4 volts, and for which the nominal voltage swing is about 3.3 volts. According to this standard, as well known in the art, these voltages are based on a power supply voltage that is nominally at 3.30 volts, and which has a specification range of between 2.70 volts and 3.60 volts.

According to the preferred embodiment of the invention, the bus voltage is substantially reduced from this conventional 3.3v bus level, for example to a bus voltage of about 1.8 volts, defining the nominal voltage swing at about 1.80 volts. In this case, an example of the minimum high output level voltage $V_{OH-R}$ limit may be about 1.44 volts (80% of the nominal power supply voltage) and an example of the maximum low output level voltage $V_{OL-R}$ may be about 0.36 volts (20% of the nominal power supply voltage). In this reduced voltage operation, these voltages are based on a power supply voltage that is nominally at 1.80 volts, and which is permitted to range from about 1.60 volts to about 2.0 volts. It can be readily calculated that the current consumed in this advanced operating mode operation is not substantially higher, and may be slightly lower, than in the normal operating mode at the higher voltage swing, even though the data rate is higher. This is because the voltages to which the parasitic capacitances must be charged, by data transitions at each output, are lower than in the normal operating mode at the higher voltage swing. However, the lower voltage swing of the input/output signals results in the power consumption in this advanced operating mode to be substantially lower than that consumed in conventional flash memory cards. This substantial reduction in power consumption is attained in combination with a substantial improvement in data transfer rate, approaching doubling of the data rate for large bursts.

According to the preferred embodiment of the invention, therefore, in which the advanced read data transfer is executed at these lower bus voltages (relative to conventional flash memory devices), the current consumed in the advanced mode is no worse than that consumed by conventional flash memory devices in the normal operating mode. And, according to this preferred embodiment of the invention in which flash memory device 10 has the capability of operating in the normal operating mode as well, the lower bus voltage is used in both the advanced mode and the normal operating mode, as well as for other operations including the communication of commands and address value. As such, flash memory device 10 consumes less power, in its transfer of data, than conventional flash memory devices.

As evident from the foregoing, command and address signals are communicated in the normal operating mode. For ease of implementation, the bus voltage for the communication of these signals is also preferably maintained at the lower bus voltage (e.g., 1.8 volts), providing additional reduction in the power consumption of flash memory card 25.

Referring back to FIG. 5a, flash memory device 10 according to this embodiment of the invention is capable of responding to a suspend request from controller 30. It is contemplated, according to this invention, that a suspend of the read data transfer may be deemed necessary by controller 30 for any one of a number of reasons, for example if its internal receive data buffer is full. As such, decision 51 of FIG. 5a determines whether such a suspend is required. If not, the high-speed read data transfer continues in process 56, in the manner described above relative to FIG. 6a.

Figure 6B:
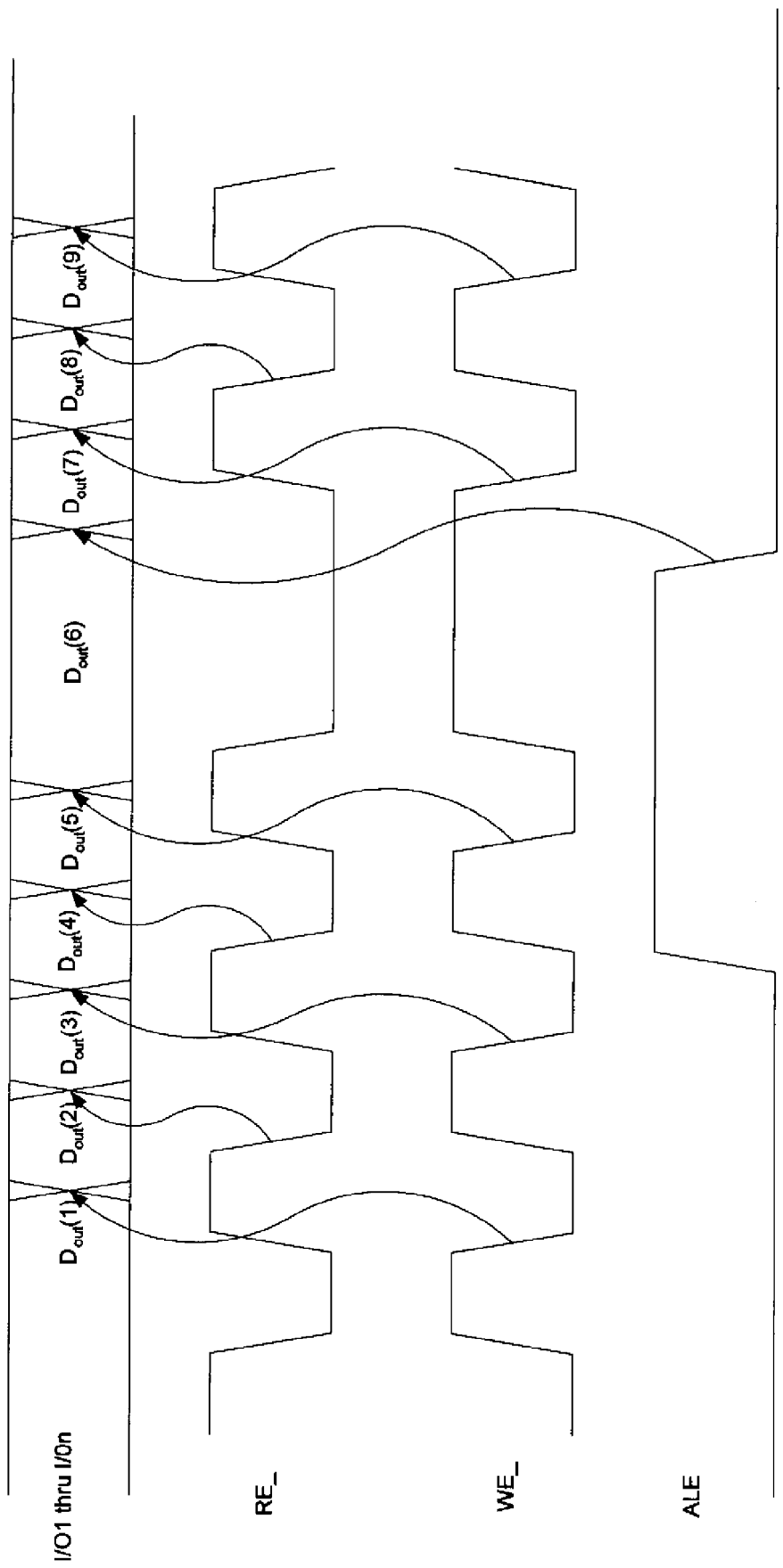

If controller 30 requires a suspend of the read data transfer (decision 51 is YES), it issues a suspend request in process 52. In this exemplary implementation, this request is made by controller 30 asserting an active high level on address latch enable signal ALE during the read transfer operation. FIG. 6b illustrates such a suspend operation, occurring during a read data transfer in the advanced mode (i.e., after the mode has been invoked and the data transfer has begun). In the example of FIG. 6b, controller 30 requests the data transfer suspend by asserting address latch enable signal ALE during the data transfer from flash memory device 10 to controller 30. In response flash memory device 10 suspends read enable signal RE_ and write enable signal WE_ (either when at a low level or a high level, as shown), and thus delays the issuing of a next data word after read enable signal RE_ and write enable signal WE_ are suspended. Given the rapid switching rate of read enable signal RE_, write enable signal WE_, and input/output lines I/O1 through I/On in this advanced mode, it is contemplated that one or two additional data words, and the corresponding edges of read enable signal RE_ and write enable signal WE_, may be driven by flash memory device 10 after address latch enable signal ALE is driven active high to request the suspend. In this example, controller 30 has asserted address latch enable signal ALE during output data word $D_{out}(4)$, and flash memory device 10 responds by holding further transitions of read enable signal RE_, write enable signal WE_, and input/output lines I/O1 through I/On during output data word $D_{out}(6)$.

This suspension of further data transfer continues until controller 30 executes process 54 to inactivate address latch enable signal ALE, thus ending the suspend. As shown in FIG. 6b, the suspend state is ended upon controller 30 taking address latch enable signal ALE to an inactive low state. According to this embodiment of the invention, this transition of address latch enable signal ALE serves as the read data strobe for the next output data word from flash memory device 10, namely data word $D_{out}(7)$ in this example. After this initial post-suspend data word, flash memory device 10 again generates the strobe signals by asserting transitions of read enable signal RE_ and write enable signal WE_ as shown. The next operative transition of write enable signal WE_ in this example, is the strobe for the second output data word $D_{out}(8)$ following the end of the suspend period, and the next operate transition of read enable signal RE_ is the strobe for the third output data word $D_{out}(9)$ after the suspend period. The advanced mode read data transfer continues, in process 56, as shown in FIG. 6b.

Referring back to FIG. 5a, the advanced mode read data transfer continues until such time as controller 30 wishes to terminate the transfer, which it indicates to flash memory device 10 in processes 58, 59. Typically, this transfer will be terminated upon controller 30 determining that the end of a page within flash memory device 10 is being reached, although the transfer may also be terminated by controller 30 for other reasons (e.g., upon receiving all of the desired data for the operation).

Figure 6C:
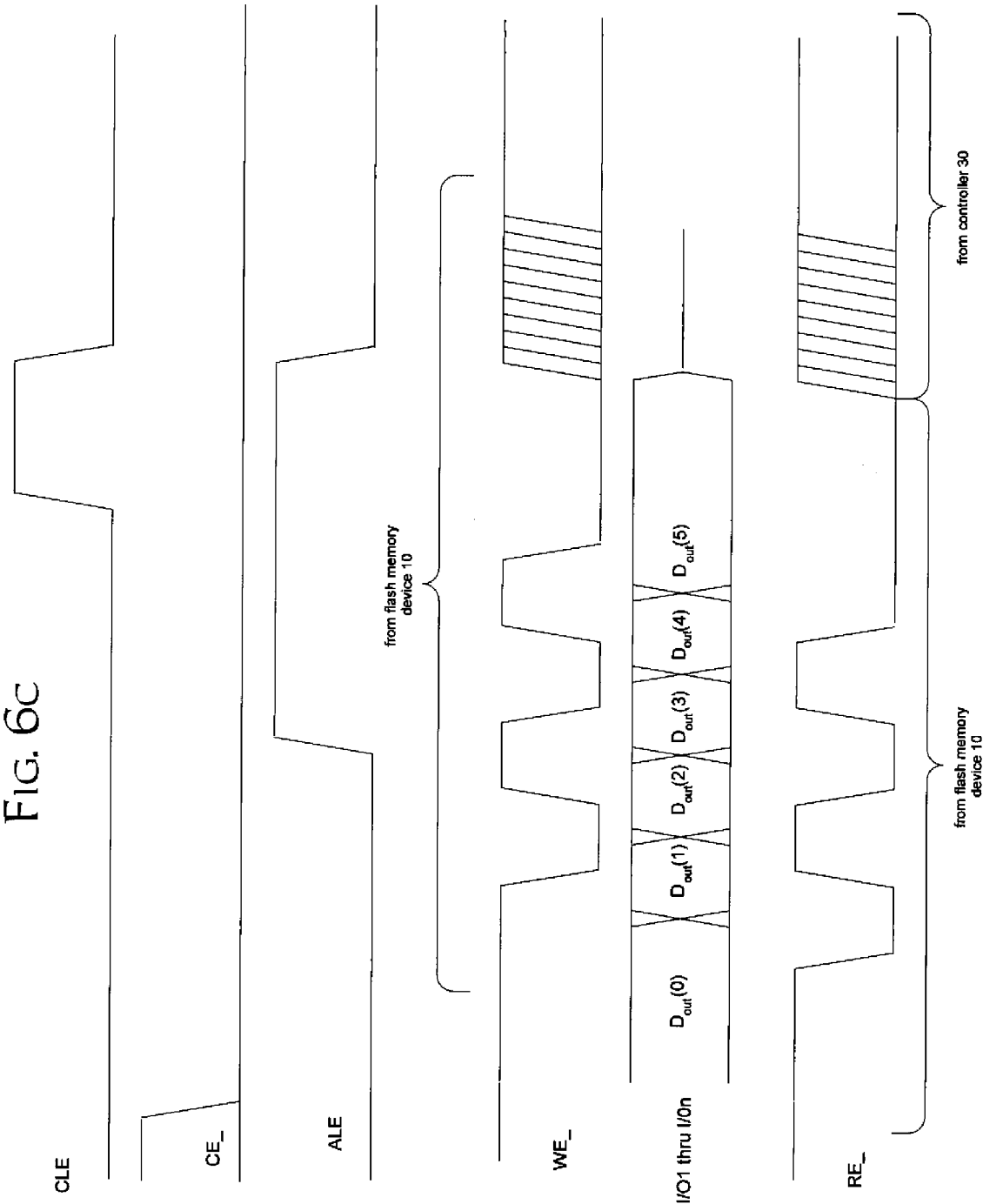

According to this example, to terminate this data transfer, controller 30 first issues a suspend in process 58, for example by asserting an active high level of address latch enable signal ALE as described above. FIG. 6c illustrates this example of the termination processes 58, 59, within which is shown the transition of address latch enable signal ALE during the advanced read data transfer operation. This suspend operation of process 58 is transformed into termination of the advanced read data transfer by controller 30 performing process 59 during the suspend operation. Alternatively, process 59 may be performed after flash memory device 10 itself determines that its output data has reached the end of a page, in which case flash memory device 10 itself maintains read enable signal RE_ and write enable signal WE_ at their last levels, and maintains the current (i.e., last) output data word on input/output lines I/O1 through I/On; in this case, address latch enable signal ALE will remain inactive low. In the example shown in FIG. 6c, this data transfer is terminated by controller 30 asserting an active high level on command latch enable signal CLE while address latch enable signal ALE is active high. In response to this transition of command latch enable signal CLE, flash memory device 10 controls its output drivers to place input/output lines I/O1 through I/On into a high impedance state, and also releases its control of the conductor corresponding to read enable signal RE_ and write enable signal WE_, in both cases permitting controller 30 to take control of these lines when appropriate, while avoiding data contention issues. As shown in the example of FIG. 6c, because the suspend and terminate operations occurred with read enable signal RE_ and write enable signal WE_ at a low level, controller 30 will drive an inactive high level on the corresponding line once it takes control of the read enable signal RE_, and write enable signal WE_ causing a transition as shown; if the suspend and terminate operations occurred with either or both of these signals already at a high level, there would of course be no transition on that line.

Flash memory device 10 then returns to the normal operating mode ("legacy" mode), passing control back to process 44 in the flow diagram of FIG. 5a. A new advanced mode read data transfer will require another instance of initiate process 48, according to this preferred embodiment of the invention.

Further in the alternative, an unconditional termination will occur if controller 30 de-asserts chip enable signal CE_. However, it is contemplated that this uncontrolled termination could result in "glitches" and other spurious and unspecified events both internally to and externally from flash memory device 10 and controller 30.

Figure 6D:
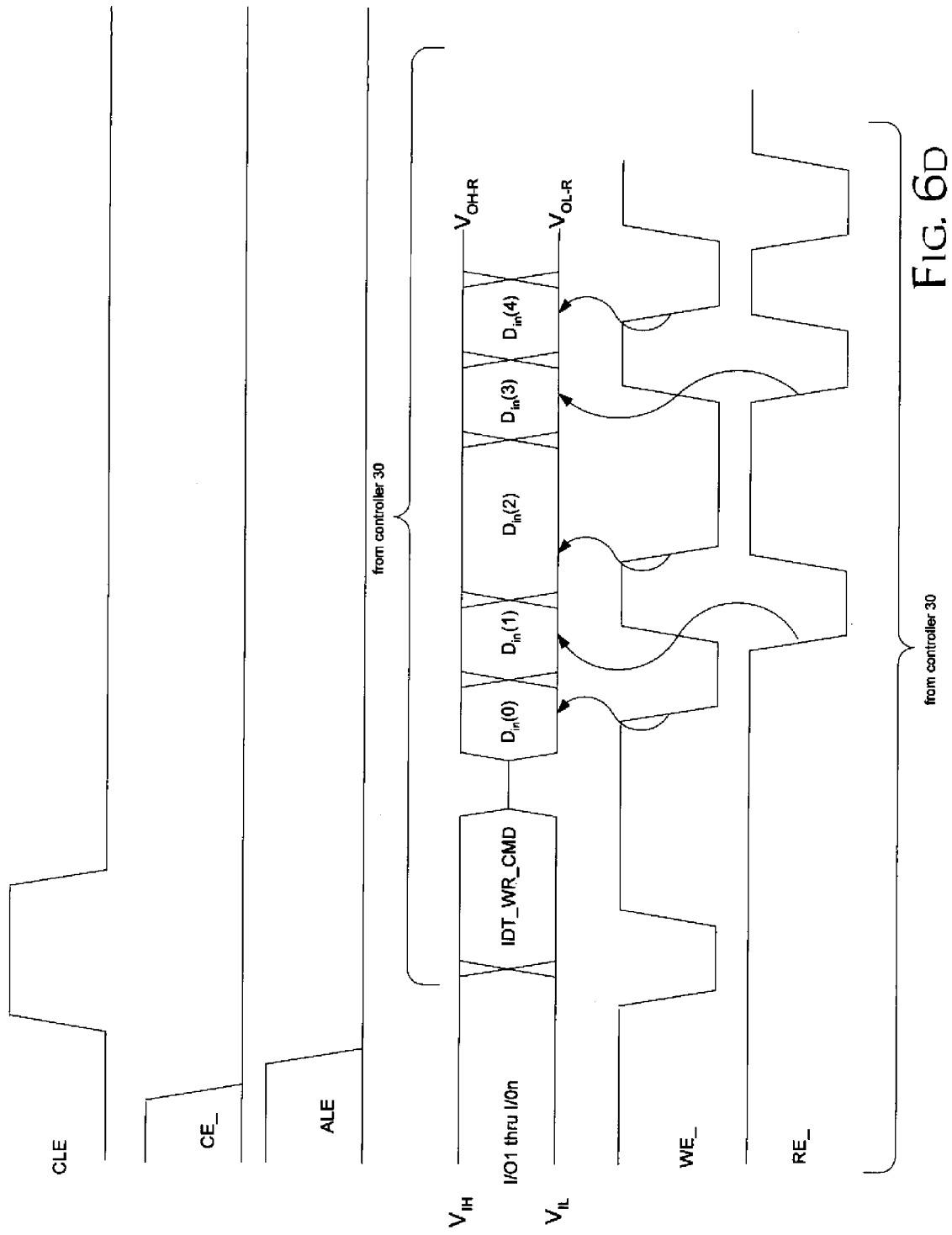
Figure 6E:

According to this preferred embodiment of the invention, an advanced, high performance, mode is also provided for the transfer of data from controller 30 to flash memory device 10, in other words for write data transfer operations. The flow diagram of FIG. 5b, together with the timing diagrams of FIGS. 6a and 6d through 6e, illustrate this operation, as will now be described.

To effect the advanced mode write data transfer, flash memory device 10 begins from the normal operating mode, as entered in process 60. As in the case of the read data transfer, normal mode operations (if any) may first be carried out, in process 62. In process 64, controller 30 issues an address value to flash memory device 10, in this normal operating mode as described above relative to FIG. 4b. And in process 66, controller 66 initiates the advanced data transfer mode in similar fashion as performed for the advanced read data transfer described above relative to FIG. 6a. It is contemplated that the write data transfer in this advanced mode will be executed, through process 66, substantially identically as was the read data transfer, except with a different command value IDT_WR_CMD, to indicate that the advanced mode data transfer is a write operation (controller 30 to flash memory device 10) rather than a read. This different value permits both of the write enable signal WE_ and the read enable signal RE_ to be used within the write transfer itself, as will be described below.

In process 68, controller 30 and flash memory device 10 carry out the advanced write data transfer. FIG. 6d illustrates the timing of signals in an example of this operation, including process 66 in which the combination of command value IDT_WR_CMD, an active high level for command latch enable CLE, and an active low pulse for write enable signal WE_ are issued by controller 30 to flash memory device 10, thus initiating the advanced mode data transfer. As in the previous example, address latch enable signal ALE is maintained at an inactive low level, and chip enable signal CE_ is maintained active low. And because this operation will be a data write, read enable signal RE_ (not shown in FIG. 6d) will be held inactive high by controller 30 throughout. Because write data transfer process 68 remains under the full control of controller 30, in this embodiment of the invention, the latency between the issuing of the command IDT_WR_CMD and the beginning of the write data transfer can be much shorter than that prior to the first output data word in the read data transfer (FIG. 6a). Preferably, a specified time elapses between the rising edge of the pulse of write enable signal WE_ corresponding to the initiation command IDT_WR_CMD, and the falling edge of the first pulse of write enable signal WE_ (or read enable signal RE) corresponding to the first input data word $D_{in}(0)$ as shown.

Once the write data transfer begins, in this preferred embodiment of the invention, falling edges of write enable signal WE_ and read enable signal RE_ serve as write data strobes, asserted by controller 30. Of course, rising edges of these signals may alternatively be used. In addition, as in the case of the read data transfer, the data transfer rate in this write operation is increased by write enable signal WE_ and read enable signal RE_ having an out-of-phase relationship with one another, preferably a 180° phase relationship to maximize the data transfer rate. As shown in FIG. 6d, this permits controller 30 to issue a new valid write data word $D_{in}(k)$ onto input/output lines I/O1 through I/On synchronously with each falling edge of both write enable signal WE_ and read enable signal RE_. As a result, the write data transfer rate in this advanced mode can approach twice the data rate of a normal operating mode write operation, for the same frequency of write enable signal WE_ and read enable signal RE_ as in the normal, legacy, operating mode.

According to this embodiment of the invention, referring back to FIG. 5b, suspend decision 69 may also be performed in the advanced mode write data transfer. Typically, the need for a write suspend is determined solely by controller 30, it being contemplated that flash memory device 10 can receive input data at this data rate without buffer overflow, etc. If no suspend is necessary (decision 69 is NO), the data transfer continues in process 72. If controller 30 requires it (decision 69 is YES), the suspend of the write data transfer is effected in process 70. In this example, suspend process 70 is effected simply by controller 30 extending the state of write enable signal WE_ and read enable signal RE_ as long as necessary. This suspension may be performed in either state (write enable signal WE_ and read enable signal RE_ held high or held low); FIG. 6d illustrates suspend process 70 during the duration of write data word $D_{in}(2)$, in which write enable signal WE_ is held low and read enable signal RE_ is held high. Of course, controller 30 does not issue additional write data words $D_{in}(k)$ during suspend process 70. The end of the suspend period is effected merely by controller 30 driving a falling edge transition of write enable signal WE_ or read enable signal RE_, together with the next valid write data word $D_{in}(3)$ in the example shown in FIG. 6d, to continue the write data transfer (process 72).

And, as in the read data transfer case, the voltage levels of the data and control signals (input/output lines I/O1 through I/On, and the lines for write enable signal WE_ and read enable signal RE_) are preferably at a lower voltage level than the conventional levels, for example with a 1.8 volt "swing" between the high and low logic levels. As discussed above in detail, this lower voltage bus will maintain the power consumed by this advanced write data transfer mode at or below that consumed in conventional flash memory systems operating in the normal operating mode, at half the data rate.

Referring back to FIG. 5b in combination with FIG. 6e, termination of the write data transfer is effected in the identical manner as the termination of the read data transfer. In process 74, controller 30 asserts address latch enable signal ALE to an active high level in process 74 to suspend the transfer, and then asserts command latch enable signal CLE to an active high level (while maintaining address latch enable signal ALE high) in process 76, which then terminates the write data transfer. FIG. 6e illustrates the timing of the various signals in terminating a write data transfer. Write enable signal WE_ and read enable signal RE_ are either held at or driven to a high level as shown in FIG. 6e, after the last data word $D_{in}(5)$ (in this example) has been latched. Following termination of the advanced mode write data transfer, effected by holding the high levels at address and command latch enable signals ALE, CLE, respectively, for a specified pulse width, the normal operating mode of flash memory device 10 and controller 30 is then again entered.

In this example, the normal operating mode is effectively a "default" operating mode, considering that the execution of a command is required to invoke the advanced mode, and considering that the operation of flash memory device 10 returns to the normal operating mode at the termination of the data transfer (i.e., without requiring execution of a command). Alternatively, flash memory device 10 may be configured so that execution of a command is required to enter both the advanced data transfer mode and the normal operating mode, such that once flash memory device 10 is in the advanced data transfer mode, it will remain in that mode until a command to return to the normal operating mode is issued by controller 30 and executed by flash memory device 10. Of course, such an approach involves additional overhead in the nature of command sequences.

Further in the alternative, it is contemplated that the "default" operating mode of flash memory device 10 may be the advanced data transfer mode, such that all data transfers are effected in the advanced mode unless a command is issued by controller 30 to place flash memory device 10 into the normal operating mode. It is contemplated that, in this case, some indication of whether a read or a write advanced mode operation can be made by controller 30, to permit both the read and write enable signals to strobe data as discussed above. According to this alternative embodiment of the invention, once flash memory device 10 is in the normal operating mode, completion of the data transfer will result in flash memory device 10 returning to the advanced data transfer mode.

It is contemplated that other alternative approaches to entry and exiting the various operating modes of flash memory device 10 will be apparent to those skilled in the art having reference to this specification, and also that these and such other alternative implementations are within the scope of this invention as claimed.

Flash memory device 10, controller 30, and flash memory card 25 according to the preferred embodiments of the invention thus provides important advantages over conventional devices and systems. This invention enables high data transfer rates, approaching double the data rate of conventional devices and systems, while still providing command and signal compatibility with "legacy" devices that do not have the advanced capability. In addition, the lower bus voltage signals involved in the advanced data transfer mode maintain the overall device and system current and power consumption at near, or even below, that of conventional flash memory devices and systems.

As a result, it is contemplated that this invention can especially be beneficial in those digital system applications in which data transfer rates are especially critical. One such application, as discussed above, is in high-performance digital still cameras. In such cameras, the image resolution (and thus the data captured per image) now exceeds 10 megapixels, with up to 12.4 megapixel cameras now available on the market. The data transfer rate from the image sensor to flash memory is critical, however, as this data transfer rate is a direct factor in rate at which images can be captured, commonly experienced as "shutter lag" by the camera user. And because the camera user is concerned primarily with the absolute delay encountered (i.e., independent of the amount of data acquired in each image), as the image resolution increases, this load on the data transfer rate is exacerbated. Another potential application for such high data transfer rates is in the use of solid-state flash memory as mass storage media in computer systems, substantially replacing some or all of the magnetic disk drive mass storage conventionally used. The ability to use solid-state memory, rather than disk drives, is contemplated to enable further miniaturization and portability of computer systems, and also to greatly increase the functionality of modern portable and handheld systems.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A flash memory device, comprising:
   at least one memory array comprised of non-volatile memory cells arranged in rows and columns;
   a data register, for storing data corresponding to stored states of the memory cells in the at least one memory array; and
   control circuitry, coupled to the data register, coupled to input/output terminals, and coupled to a plurality of control terminals, for receiving data from the input/output terminals and for presenting data to the input/output terminals, and for controlling the operation of the device in a normal operating mode and in an advanced mode, responsive to control signals received at the control terminals;
   wherein, in the normal operating mode, the control circuitry presents data words at the input/output terminals responsive to a read data strobe signal received at a first one of the plurality of control terminals;
   wherein, in the normal operating mode, the control circuitry latches data words received at the input/output terminals into the data register, responsive to a write data strobe signal received at the second one of the plurality of control terminals;
   wherein, in the advanced operating mode for a read transfer, the control circuitry presents read data strobe signals and write data strobe signals at corresponding ones of the plurality of control terminals, the write data strobe signals out-of-phase relative to the read data strobe signals, and presents data words at the input/output terminals responsive to a selected transition of each of the read data strobe signal and the write data strobe signal.

2. The device of claim 1, further comprising:
   a command register, coupled to the control circuitry;
   wherein the control circuitry stores a command value received at the input/output terminals into the command register responsive to receiving a transition of a write data strobe signal at a corresponding one of the plurality of control terminals.

3. The device of claim 2, wherein the control circuitry enters the advanced operating mode from the normal operating mode responsive to the command value corresponding to initiation of the advanced mode, the command value also indicating whether an advanced mode read transfer or an advanced mode write transfer is to be performed.

4. The device of claim 2, wherein the control circuitry enters the normal operating mode from the advanced operating mode responsive to the command value corresponding to initiation of the normal mode.

5. The device of claim 1, wherein the normal operating mode corresponds to a standardized specification for communications between flash memory devices and controllers, the standardized specifications including a first voltage specification defining high and low logic levels for the read data strobe signal, the write data strobe signal, and the data words at the input/output terminals;
   and wherein the control circuitry presents data words, the read data strobe signal, and the write data strobe signal, according to a second specified voltage specification defining a substantially lower voltage for substantially smaller voltage swing than that defined by the high and low logic levels in the first specified voltage specification.

6. The device of claim 5, wherein the voltage swing defined by the high and low logic levels in the first specified voltage specification is nominally about 3.3 volts;

and wherein the voltage swing defined by the high and low logic levels in the secondly specified voltage specification is nominally about 1.8 volts.

7. The device of claim 1, further comprising:
a command register, coupled to the control circuitry;
wherein the control circuitry stores a command value received at the input/output terminals into the command register responsive to receiving a transition of a write data strobe signal at a second one of the plurality of control terminals in combination with a command latch enable signal received at a third one of the plurality of control terminals;
and wherein the control circuitry enters the advanced operating mode from the normal operating mode responsive to the command value corresponding to initiation of the advanced mode, the command value also indicating whether an advanced mode read transfer or an advanced mode write transfer is to be performed.

8. The device of claim 7, wherein the control circuitry, in the advanced operating mode, holds a current value of a data word at the input/output terminals and a current state of the read data strobe signal and the write data strobe signal at the first one of the plurality of control terminals responsive to receiving a suspend request signal at one of the plurality of control terminals.

9. The device of claim 8, wherein the control circuitry resumes the presenting of data words to the controller in the advanced data transfer mode and the driving of the read data strobe signal and the write data strobe signal responsive to receiving an end of the suspend request from the controller.

10. The device of claim 9, wherein the control circuitry receives a memory address from the controller over the input/output lines in combination with a transition of a selected polarity of a write data strobe signal from the controller, and in combination with receiving an address latch enable signal from the controller;
and wherein the suspend request corresponds to a transition of the address latch enable signal during the presenting of data words to the controller in the advanced data transfer mode.

11. A flash memory subsystem, comprising:
a flash memory controller, having a host interface for interfacing to a host system;
a data bus, coupled to the flash memory controller;
a plurality of control lines, coupled to the flash memory controller;
a flash memory device, coupled to the data bus and the plurality of control lines, and comprising:
at least one memory array comprised of non-volatile memory cells arranged in rows and columns;
a data register, for storing data corresponding to stored states of the memory cells in the at least one memory array; and
control circuitry, coupled to the data register, coupled to the data bus, and coupled to the plurality of control lines, for receiving data from the data bus and for presenting data to the data bus, and for controlling the operation of the device in a normal operating mode and in an advanced mode, responsive to control signals received on the control lines;
wherein, in the normal operating mode, the control circuitry presents data words on the data bus responsive to a read data strobe signal received from the controller;
wherein, in the normal operating mode, the control circuitry latches data words received at the input/output terminals into the data register, responsive to a write data strobe signal received from the controller;
wherein, in the advanced operating mode for a read transfer, the control circuitry presents read data strobe signals and write data strobe signals to the controller, the write data strobe signals out-of-phase relative to the read data strobe signals, and presents data words on the data bus responsive to a selected transition of each of the read data strobe signal and the write data strobe signal.

12. The system of claim 11, wherein the flash memory device further comprises:
a command register, coupled to the control circuitry;
wherein the control circuitry stores a command value received on the data bus into the command register responsive to receiving a transition of a write data strobe signal from the controller.

13. The system of claim 12, wherein the control circuitry enters the advanced operating mode from the normal operating mode responsive to the command value corresponding to initiation of the advanced mode, the command value also indicating whether a read data transfer or a write data transfer is to be performed.

14. The system of claim 12, wherein the control circuitry enters the normal operating mode from the advanced operating mode responsive to the command value corresponding to initiation of the normal mode.

15. The system of claim 11, wherein the normal operating mode corresponds to a standardized specification for communications between flash memory devices and controllers, the standardized specifications including a first voltage specification defining high and low logic levels for the read data strobe signal, the write data strobe signal, and the data words;
and wherein the control circuitry of the flash memory device and the flash memory controller both present data words, the read data strobe signal, and the write data strobe signal, according to a second specified voltage specification defining a substantially lower voltage for substantially smaller voltage swing than that defined by the high and low logic levels in the first specified voltage specification.

16. The system of claim 15, wherein the voltage swing defined by the high and low logic levels in the first specified voltage specification is nominally about 3.3 volts;
and wherein the voltage swing defined by the high and low logic levels in the secondly specified voltage specification is nominally about 1.8 volts.

17. The system of claim 11, wherein, in the advanced operating mode, the control circuitry latches data words received on the data bus into the data register, responsive to transitions of a selected polarity of the read data strobe signal and the write data strobe signal received from the flash memory controller.

18. The system of claim 11, wherein the flash memory device further comprises:
a command register, coupled to the control circuitry;
wherein the control circuitry stores a command value received on the data bus into the command register responsive to receiving a transition of a write data strobe signal and a command latch enable signal from the flash memory controller;
and wherein the control circuitry enters the advanced operating mode from the normal operating mode responsive to the command value corresponding to initiation of the advanced mode, the command value also indicating whether a read data transfer or a write data transfer is to be performed.

19. The system of claim 18, wherein the control circuitry, in the advanced operating mode, holds a current value of a data word on the data bus and a current state of the read enable signal and of the write enable signal responsive to receiving a suspend request signal from the flash memory controller.

20. The system of claim 19, wherein the control circuitry resumes the presenting of data words to the controller in the advanced data transfer mode and the driving of the read data strobe signal responsive to receiving an end of the suspend request from the controller.

21. The system of claim 17, wherein the control circuitry receives a memory address from the controller over the input/output lines in combination with a transition of a selected polarity of the write data strobe signal from the controller, and in combination with receiving an address latch enable signal from the controller;

and wherein the suspend request corresponds to a transition of the address latch enable signal during the presenting of data words to the controller in the advanced data transfer mode.

* * * * *